United States Patent [19]

Ishikawa et al.

[11] Patent Number: 5,227,274
[45] Date of Patent: Jul. 13, 1993

[54] PROCESS FOR PREPARATION OF LIGHT-SENSITIVE MATERIAL CONTAINING MICROCAPSULES

[75] Inventors: Shunichi Ishikawa; Taku Nakamura, both of Kanagawa, Japan

[73] Assignee: Fuji Photo Film Co., Ltd., Kanagawa, Japan

[21] Appl. No.: 803,420

[22] Filed: Dec. 6, 1991

[30] Foreign Application Priority Data

Dec. 6, 1990 [JP] Japan .................................. 2-405364
Dec. 12, 1990 [JP] Japan .................................. 2-409839

[51] Int. Cl.$^5$ .................................................. G03C 1/72
[52] U.S. Cl. .................................. 430/138; 430/203; 430/281; 430/569; 430/935; 264/4.3; 264/4.7
[58] Field of Search ............... 430/138, 203, 281, 617, 430/619, 569, 627, 631, 935, 200; 503/215; 428/402.21; 264/4.3, 4.7

[56] References Cited

U.S. PATENT DOCUMENTS 4,871,641 10/1989 Kakimi .................................. 430/138
5,039,589 8/1991 Takahashi .......................... 430/138

Primary Examiner—Marion E. McCamish
Assistant Examiner—Janis L. Dote
Attorney, Agent, or Firm—Sughrue, Mion, Zinn, Macpeak & Seas

[57] ABSTRACT

A process for preparation of a light-sensitive material containing microcapsules is disclosed. The light-sensitive material comprises a light-sensitive layer provided on a support. The microcapsules are dispersed in the light-sensitive layer. The process of the present invention comprises the steps of: (1) mixing a silver halide emulsion and the reducing agent or the photopolymerization initiator with the polymerizable compound to prepare a light-sensitive composition; (2) emulsifying the composition in an aqueous medium to prepare an aqueous emulsion; (3) forming a shell around the droplets of the composition contained in the aqueous emulsion to prepare a microcapsule dispersion; (4) coagulating the aqueous medium to set the microcapsule dispersion; (5) storing the set microcapsule dispersion; (6) melting the aqueous medium to prepare a coating solution of the light-sensitive layer; and (7) coating the solution on the support. Between the steps (2) and (3), the process preferably further contains the steps of: (a) precipitating the droplets of the light-sensitive composition in the aqueous emulsion; (b) removing at least 50% of the supernatant medium from the droplets; and (c) emulsifying the droplets in an aqueous medium again.

10 Claims, 4 Drawing Sheets

PROCESS FOR PREPARATION OF LIGHT-SENSITIVE MATERIAL CONTAINING MICROCAPSULES

FIELD OF THE INVENTION

The present invention relates to a process for preparation of a light-sensitive material containing microcapsules.

BACKGROUND OF THE INVENTION

U.S. Pat. No. 4,912,011 discloses a light-sensitive material comprising a support and a light-sensitive layer provided thereon which contains silver halide, a reducing agent, a polymerizable compound and a color image forming substance. The silver halide, the reducing agent, the polymerizable compound and the color image forming substance are contained in microcapsules (light-sensitive microcapsules) which are dispersed in the light-sensitive layer. The U.S. Patent corresponds to Japanese Patent Provisional Publications No. 61(1986) 275742 and No. 61(1986)-849 and European Patent Provisional Publication No. 0203613A.

An image forming method using the light-sensitive material is also disclosed in U.S. Patent 4,912,011. The method comprises the steps of imagewise exposing the light-sensitive material, and heating the light-sensitive material. A latent image of the silver halide is formed by the exposure. The polymerizable compound is polymerized by heating within the area where the latent image has been formed. The light-sensitive material is then pressed on an image-receiving material to transfer the unpolymerized polymerizable compound with a color image forming substance to the image-receiving material to form a color image on the image-receiving material.

Further, a method of polymerizing the polymerizable compound within the area where the latent image of the silver halide has not been formed is disclosed in Japanese Patent Provisional Publications No. 61(1986)-243449, No. 61(1986)-260241, No. 2(1990)-141756 and No. 2(1990) 141757. The contents of the former two publications are described in European Patent Provisional Publication No. 0202490A.

On the other hand, U.S. Pat. Nos. 4,440,846, 4,483,912 and 4,554,235 disclose a light-sensitive material comprising a support and a light-sensitive layer provided thereon which contains a photopolymerization initiator, a polymerizable compound and a color image forming substance. The photopolymerization initiator, the polymerizable compound and the color image forming substance are contained in microcapsules (light-sensitive microcapsules) which are dispersed in the light-sensitive layer. U.S. Pat. No. 4,440,846 corresponds to Japanese Patent Provisional Publications No. 57(1982).179836, No. 58(1983) 88739 and No. 58(1983).88740. U.S. Pat. No. 4,483,912 corresponds to Japanese Patent Provisional Publications No. 59(1984)-30537 and No. 59(1984)-137944. U.S. Pat. No. 4,554,235 corresponds to Japanese Patent Provisional Publication No. 60(1985)-259490.

An image forming method using the photopolymerization initiator comprises imagewise exposing the light-sensitive material to imagewise polymerize the polymerizable compound by the photopolymerization initiator. The light-sensitive material is then pressed on an image-receiving material to transfer the unpolymerized polymerizable compound with a color image forming substance to the image-receiving material to form a color image on the image-receiving material.

The above-mentioned light-sensitive materials are prepared by a process comprising the steps of: (I) mixing a silver halide emulsion and a reducing agent (U.S. Pat. No. 4,912,011 et al.) or a photopolymerization initiator (U.S. Pat. No. 4,440,846 et al.) with a polymerizable compound to prepare a light-sensitive composition; (II) emulsifying the composition in an aqueous medium to prepare an aqueous emulsion; (III) forming a shell around the droplets of the composition contained in the aqueous emulsion to prepare a microcapsule dispersion; (IV) preparing a coating solution of the light-sensitive layer from the microcapsule dispersion and (V) coating the solution on a support.

FIGS. 3A and 3B are flowcharts schematically illustrating the conventional process for preparation of the light-sensitive material containing silver halide and a reducing agent. The light-sensitive material shown in FIG. 3A is a preferred embodiment wherein a color image forming substance and a base precursor in addition to the silver halide, the reducing agent and the polymerizable compound are contained in microcapsules. The light-sensitive material shown in FIG. 3B also is a preferred embodiment which forms a color image by using blue, green and red sensitive microcapsules.

At the step (I), a color image forming substance (32), a solution of a reducing agent (33), a dispersion of a base precursor (34) and a silver emulsion (35) are mixed with a polymerizable compound (31) to prepare a light-sensitive composition (36). At the step (II), the light-sensitive composition (36) is emulsified in an aqueous medium (37) to prepare an aqueous emulsion (38). At the step (III), a shell is formed around the droplets of the composition contained in the aqueous emulsion (38) to prepare a microcapsule dispersion (39). At the step (IV), a blue sensitive microcapsule dispersion (41), a green sensitive microcapsule dispersion (42) and a red sensitive microcapsule dispersion (43) are mixed to prepare a coating solution of the light-sensitive layer (44). At the step (V), the coating solution (44) is coated on a support (45) to prepare a light-sensitive material (46).

The above-mentioned light-sensitive materials can be used for various technical fields such as color photography, printing and copying (e.g., a computer-graphic hard copy and a color copy). Accordingly, various kinds of the light-sensitive material are required in practical use. The difference practical uses require different light-sensitive materials, particularly with respect to spectral sensitivity and hue of the formed color.

SUMMARY OF THE INVENTION

The applicants have studied the above-mentioned process for preparation of the light-sensitive material. The applicants note that the conventional process is not appropriate for mass production of various kinds of the light-sensitive material. The applicants further notes that an intermediate in preparation of the light-sensitive material is preferably stored to facilitate the mass production of the light-sensitive material.

The process for preparation of the light-sensitive material comprises the above-mentioned five steps of (I) to (V). Accordingly, there are four intermediate stages, namely (I) the light-sensitive composition, (II) the aqueous emulsion of the light-sensitive composition, (III) the microcapsules dispersion, and (IV) the coating solution of the light-sensitive layer.

According to further study of the applicants, the microcapsule dispersion is most preferably stored to facilitate the mass production of the light-sensitive material. However, the applicants note a problem when the microcapsule dispersion is stored. The specific gravity of the core of the microcapsule (namely the light-sensitive composition) is usually more than 1. Further, the microcapsules have a relatively large particle size (5 to 25 m), since the above-mentioned microcapsules contain various components. Accordingly, the microcapsules are deposited to the bottom of a vessel while the dispersion is stored. The deposited microcapsules adhere to each other. When the stored microcapsule dispersion is used for preparation of the light-sensitive material, the adhering microcapsules should be separated by stirring the dispersion. Some of the microcapsules are ruptured or destroyed by the separating process.

Therefore, when the light-sensitive material is prepared by using the stored microcapsule dispersion, the formed image is not clear because of the destroyed microcapsules. Particularly, a stain is observed on the image, and the minimum density of the image is high.

An object of the present invention is to provide a process for preparation of a light-sensitive material which forms a clear image, even if the material is prepared by using a stored microcapsule dispersion.

There is provided by the present invention a process for preparation of a light-sensitive material comprising a support and a light-sensitive layer which contains silver halide, a reducing agent and an ethylenically unsaturated polymerizable compound, said silver halide, said reducing agent and said polymerizable compound being contained in microcapsules which are dispersed in the light sensitive layer, wherein the process comprises the steps of:

(1) mixing a silver halide emulsion and the reducing agent with the polymerizable compound to prepare a light-sensitive composition;

(2) emulsifying the composition in an aqueous medium to prepare an aqueous emulsion;

(3) forming a shell around the droplets of the composition contained in the aqueous emulsion to prepare a microcapsule dispersion;

(4) coagulating the aqueous medium to set the microcapsule dispersion;

(5) storing the set microcapsule dispersion;

(6) melting the aqueous medium to prepare a coating solution of the light-sensitive layer; and (7) coating the solution on the support.

There is also provided by the invention a process for preparation of a light-sensitive material comprising a support and a light-sensitive layer which contains a photopolymerization initiator and an ethylenically unsaturated polymerizable compound, said photopolymerization initiator and said polymerizable compound being contained in microcapsules which are dispersed in the light sensitive layer, wherein the process comprises the steps of:

(1) mixing the photopolymerization initiator with the polymerizable compound to prepare a light-sensitive composition;

(2) emulsifying the composition in an aqueous medium to prepare an aqueous emulsion;

(3) forming a shell around the droplets of the composition contained in the aqueous emulsion to prepare a microcapsule dispersion;

(4) coagulating the aqueous medium to set the microcapsule dispersion;

(5) storing the set microcapsule dispersion;

(6) melting the aqueous medium to prepare a coating solution of the light-sensitive layer; and (7) coating the solution on the support.

In the case that the shell of the microcapsules is made of an amino-aldehyde resin, between the above-mentioned steps (2) and (3), the process preferably further contains the steps of:

(a) precipitating the droplets of the light-sensitive composition in the aqueous emulsion;

(b) removing at least 50% of the supernatant medium from the droplets; and (c) emulsifying the droplets in an aqueous medium again.

The above-mentioned deposition of the microcapsules can be prevented by stirring the microcapsule dispersion or shaking the vessel containing the dispersion while the dispersion is stored. It requires a specific apparatus to stir the dispersion or to shake the vessel. Further, some of the microcapsules are ruptured or destroyed by stirring the dispersion or shaking the vessel.

The applicants found that the microcapsule dispersion 15 can be preserved without causing the deposition and destroying the microcapsules by the above-mentioned steps (4) to (6). Therefore, the light-sensitive material prepared according to the present invention forms a clear image, though the material is prepared by using a stored microcapsule dispersion. Further, the process of the invention using the stored microcapsule dispersion is advantageous to the mass production of various kinds of the light-sensitive material.

DETAILED DESCRIPTION OF THE INVENTION

The present invention is characterized in the above-mentioned steps (4), (5) and (6).

Figure 1:
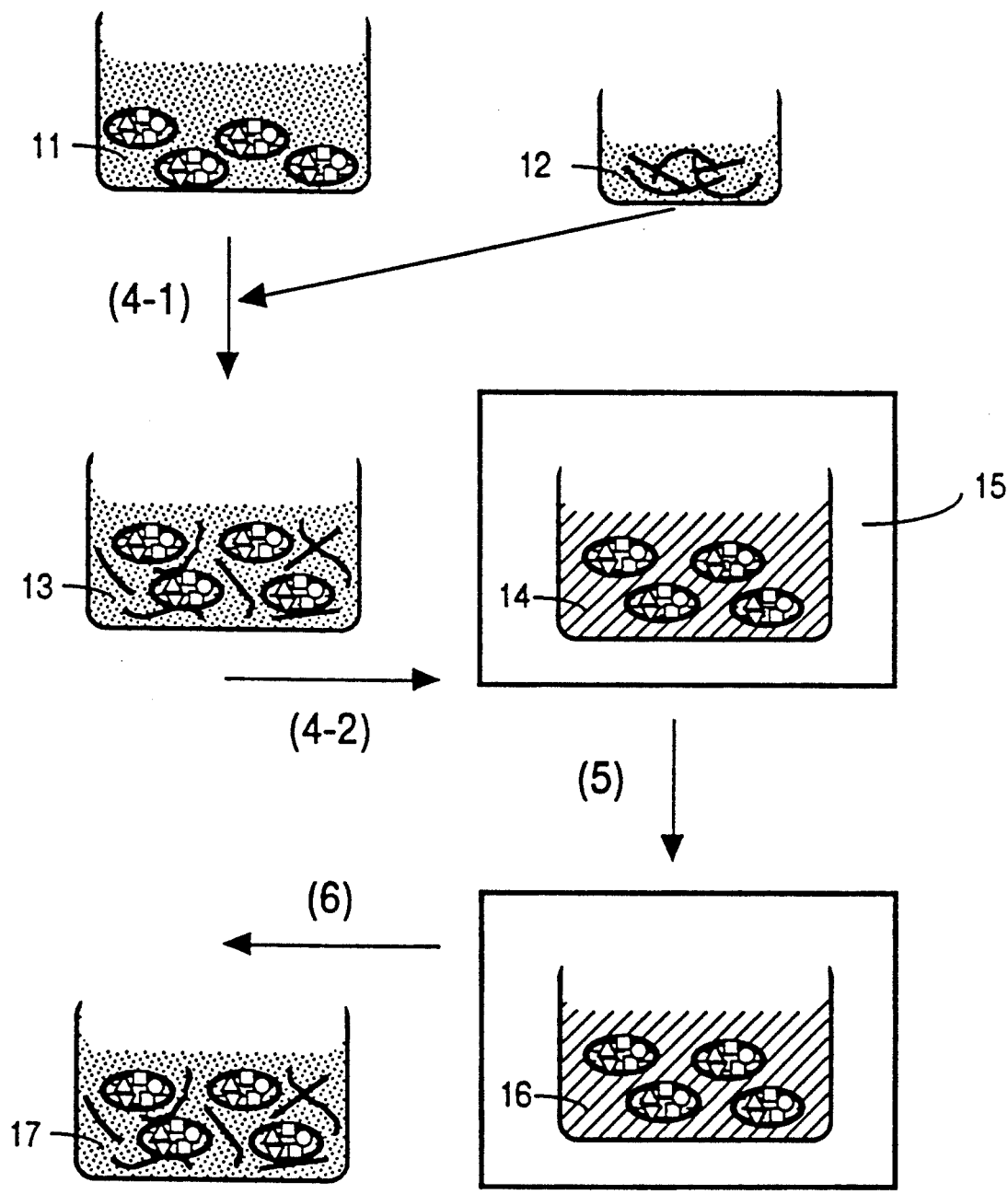
FIG. 1 is a flowchart schematically illustrating the characteristic steps (4) to (6) of the present invention.

FIG. 1 is a flowchart schematically illustrating the characteristic steps (4) to (6) of the present invention.

Figure 3A:
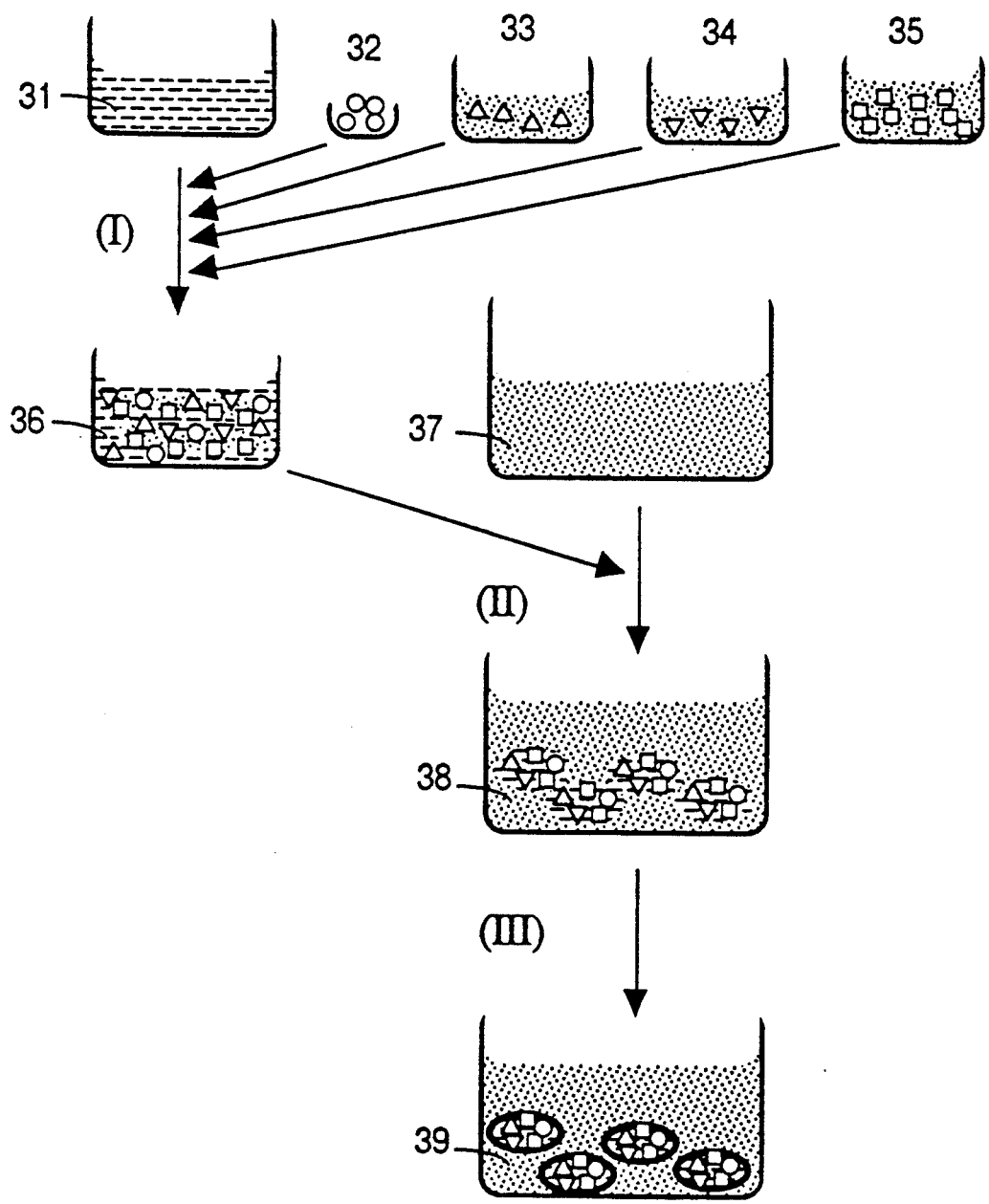
FIGS. 3A and 3B are flowcharts schematically illustrating the conventional process for preparation of the light-sensitive material.

The microcapsule dispersion (11) shown in FIG. 1 is prepared by the steps (1) to (3) of the present invention. The dispersion (11) corresponds to the microcapsule dispersion (39) shown FIG. 3A. In other words, the steps (1) to (3) of the present invention are the same as the steps (I) to (III) of the conventional process shown in FIG. 3A. At the step (4), the aqueous medium contained in the microcapsule dispersion (11) is coagulated to set the dispersion. As is shown in FIG. 1, the aqueous medium is preferably coagulated by the steps of: (4.1) adding an aqueous polymer (12) as a gelation agent to the microcapsule dispersion (13); and (4.2) cooling the dispersion containing the aqueous polymer (13). The dispersion containing the polymer (13) is cooled in a refrigerator (15) to set the dispersion (16).

At the step (5), the set microcapsule dispersion is stored in the refrigerator (15).

At the step (6), the aqueous medium is melted by heating the stored dispersion (16).

Figure 3B:
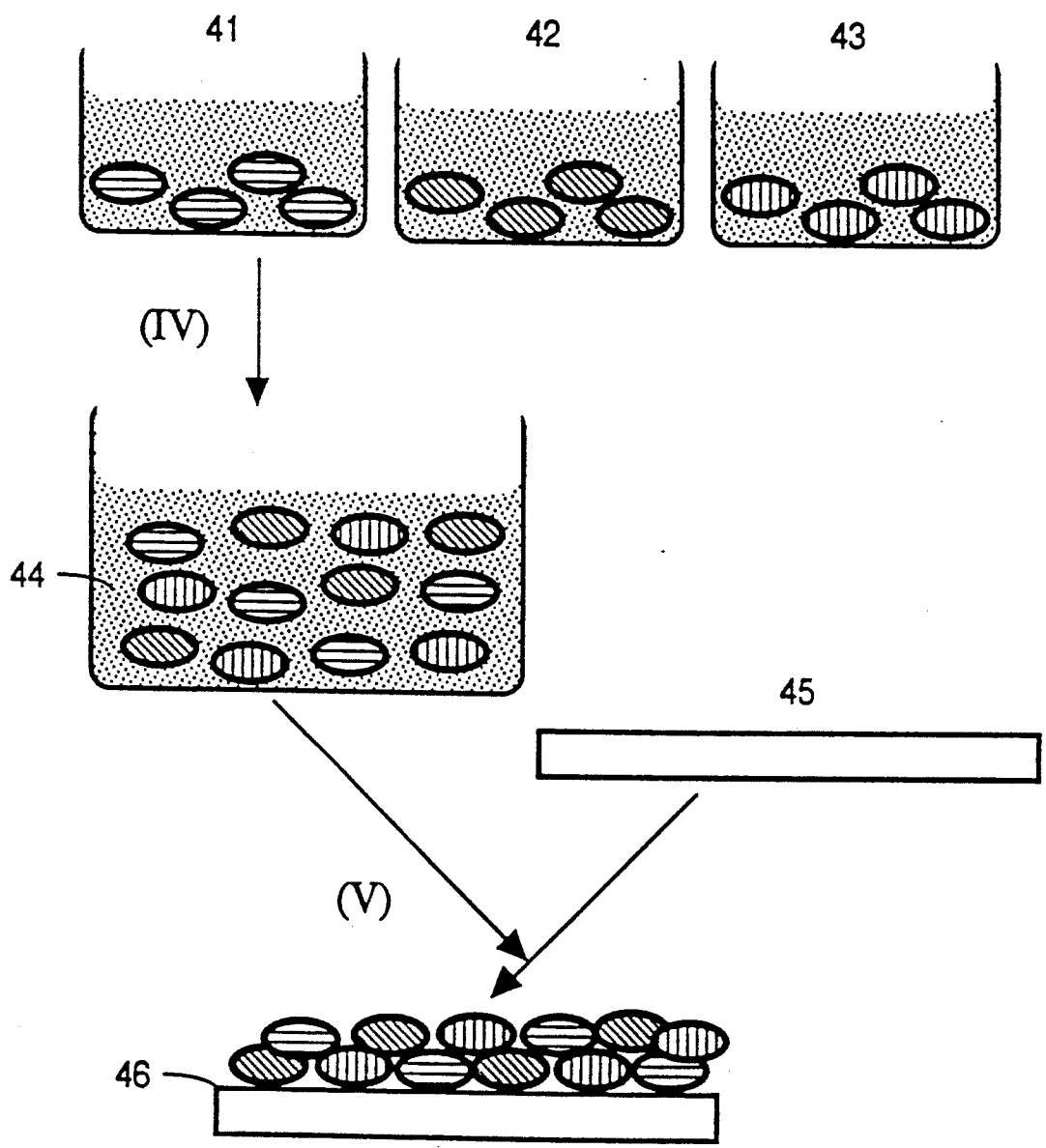

Thus obtained dispersion (17) can be used to prepare a coating solution of the light-sensitive layer. For example, a blue sensitive microcapsule dispersion, a green sensitive microcapsule dispersion and a red sensitive microcapsule dispersion may be mixed to prepare a coating solution of the light-sensitive layer, as is shown in FIG. 3B. At the step (7), the coating solution is coated on a support to prepare a light-sensitive material. The step (7) of the present invention is the same as the steps (V) of the conventional process shown in FIG. 3B.

The characteristic steps (4) to (6) of the present invention are described in more detail.

An aqueous polymer is preferably used as a gelation agent at the step (4) as is mentioned above. Examples of the aqueous gelation polymer include a polysaccharide (e.g., carrageenan, sodium alginate, agar, gellan gum, furcellaran, pectin, agarose) and a protein (e.g., gelatin). In the case that the shell of the microcapsules is made of an amino-aldehyde resin (e.g., melamine-formaldehyde resin, urea-formaldehyde resin), the polysaccharide (containing no amino group) is preferred to the protein (containing an amino group). The amino-aldehyde resin may react with the amino group contained in the protein to cause an irreversible coagulation of the microcapsule dispersion. The coagulation at the step (4) must be reversible because the aqueous medium is melted at the step (6) to use the dispersion in preparation of the coating solution of the light-sensitive layer. Carrageenan, gellan gum and furcellaran are particularly preferred aqueous gelation polymers.

The amount of the gelation agent depends on the nature of the agent, the temperature and time required for the coagulation and the strength of the coagulated medium required for the storage. The gelation agent is preferably used in the microcapsule dispersion in an amount of 0.01 to 10 weight %. The gel point of the aqueous medium is a temperature preferably in the range of 0° C. to 40° C., and more preferably in the range of 5° C. to 30° C.

After the aqueous gelation polymer is added to the microcapsule dispersion, the mixture is preferably stirred at an elevated temperature (higher than the gel point) to make a uniform dispersion. The dispersion is then quickly cooled (lower than the gel point) to set the microcapsule dispersion.

The set microcapsule dispersion is then stored at a low temperature (lower than the gel point). The microcapsule dispersion can be stored for not more than 90 days (preferably for not more than 30 days) in a refrigerator.

The stored microcapsule dispersion is then used for preparation of the coating solution of the light-sensitive layer. The required amount of the microcapsule dispersion is preferably weighed at the stored stage. By only melting the aqueous medium, a uniform microcapsule dispersion can be easily obtained without rupturing the microcapsules. The aqueous medium is melted preferably by heating the stored dispersion (higher than the gel point).

The process of the present invention preferably further contains some additional steps between the above-mentioned steps (2) and (3) in the case that the shell of the microcapsules is made of an amino-aldehyde resin. The additional steps comprise: (a) precipitating the droplets of the light-sensitive composition in the aqueous emulsion; (b) removing at least 50% of the supernatant medium from the droplets; and (c) emulsifying the droplets in an aqueous medium again.

According to study of the applicant, the aqueous emulsion prepared at the step (2) contains small droplets (having a droplet size of 1 to 3 μm) and other irregular particles in addition to the regular droplets required for preparation of the microcapsules (having a droplet size of 5 to 25 μm). The applicants found that the small droplets and the irregular particles are obstacles to formation of an amino-aldehyde resin shell around the regular droplets at the step (3). Using the above-mentioned additional steps (a) to (c), the small droplets and the irregular particles are removed with the supernatant medium. Therefore, the light-sensitive material prepared according to the process containing the additional steps forms a more clear image.

Figure 2:
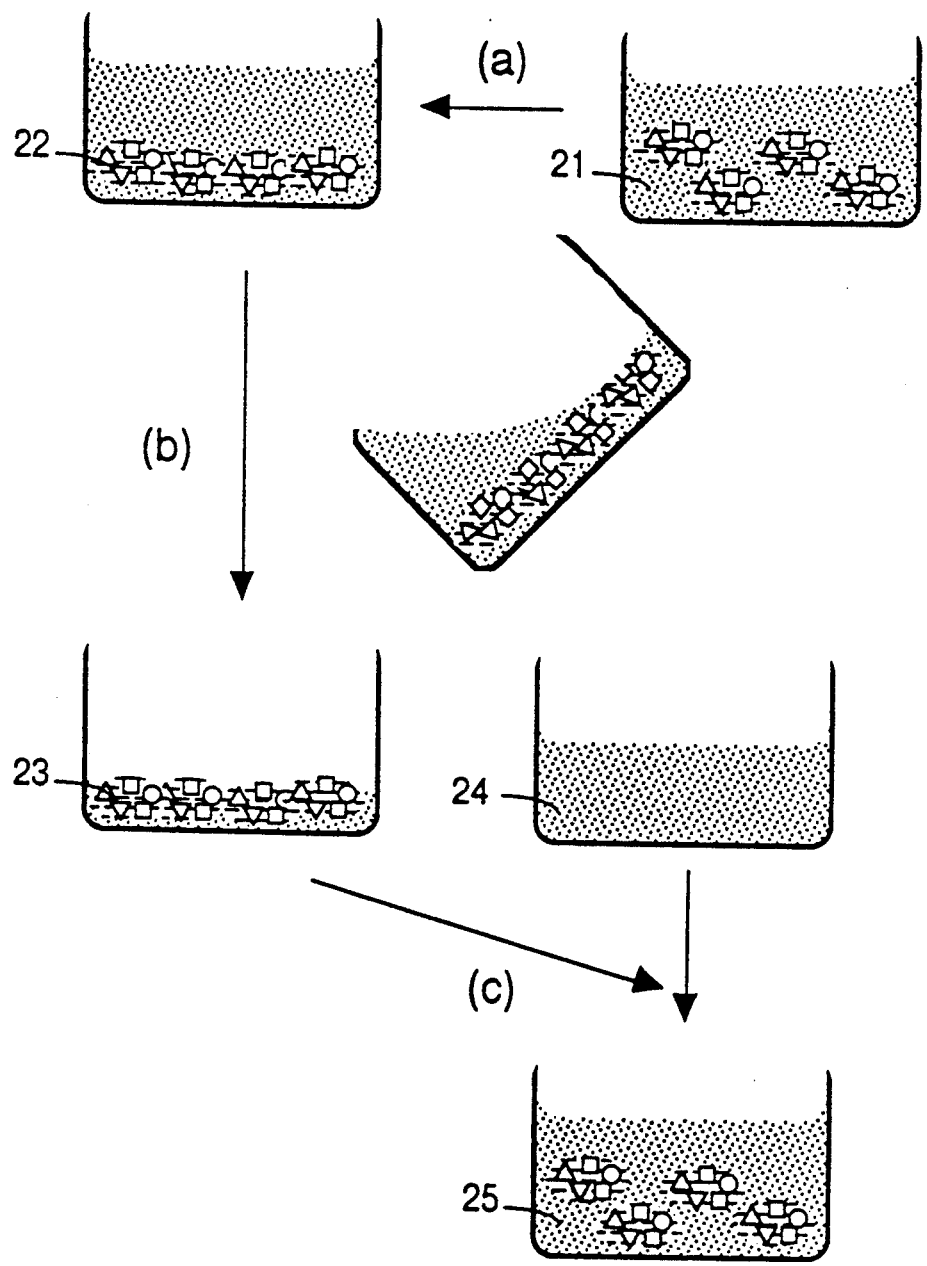
FIG. 2 is a flowchart schematically illustrating the steps (a) to (c) of the preferred embodiment of the present invention.

FIG. 2 is a flowchart schematically illustrating the steps (a) to (c) of the preferred embodiment of the present invention.

The aqueous emulsion (21) shown in FIG. 2 is prepared by the steps (1) and (2) of the present invention. The emulsion (21) corresponds to the aqueous emulsion (38) shown in FIG. 3A.

At the step (a), the droplets of the light-sensitive composition in the aqueous emulsion (21) are precipitated.

The specific gravity of the light-sensitive composition is usually more than 1. Accordingly, the droplets may be naturally precipitated by only leaving the aqueous emulsion. However, the emulsion is preferably diluted with water (which may contain a water-soluble polymer) to accelerate the precipitation. The precipitation is accelerated as the dilution is increased. On the other hand, coagulation of the droplets is caused when the emulsion is highly diluted. The dilution is preferably in the range of 1.5 to 50.

Centrifugation may be used to accelerate the precipitation. A precipitating agent may also be used so long as the precipitated droplets can be emulsified again at the step (c).

At the step (b), the supernatant medium (the small droplets and the irregular particles) is removed from the droplets (22). As is shown in FIG. 2, it is not necessary to remove all of the supernatant medium. In the present invention, it is sufficient to remove at least 50% (preferably at least 80%) of the medium.

At the step (c), the remaining droplets (23) are emulsified again in an aqueous medium (24) to obtain an aqueous dispersion, which is free from the small droplets and the irregular particles.

After the step (c), an amino-aldehyde resin shell is formed around the regular droplets at the step (3). Then, the prepared amino-aldehyde microcapsule dispersion is treated with the characteristic steps (4) to (6) of the present invention.

The light-sensitive material prepared by the present invention is described below.

In the first embodiment of the present invention, silver halide, a reducing agent and an ethylenically unsaturated polymerizable compound are contained in microcapsules. In the second embodiment of the invention, a photopolymerization initiator and an ethylenically unsaturated polymerizable compound are contained in the microcapsules. The components of the light-sensitive material are described below.

Examples of the silver halide employable for the light-sensitive material include silver chloride, silver bromide, silver iodide, silver chlorobromide, silver chloroiodide, silver iodobromide and silver chloroiodobromide in the form of grains.

The silver halide grains may be of various crystal forms, for example, a regular crystal form such as hexahedron, octahedron or tetradecahedron, an irregular form such as spherical form or tubular form, a form having crystalline defect such as a twinning plane, and a mixed form thereof.

The silver halide grains may be extremely small sized grains having a grain diameter of not more than 0.01 μm, or may be relatively large sized grains having a grain diameter of projected area up to 10 μm. The silver halide emulsion may be a polydispersed emulsion or a monodispersed emulsion described in U.S. Pat. Nos. 3,574,628 and 3,655,394, and U.K. Patent No. 1,413,748.

A tubular grain having an aspect ratio of not less than approx. 5 can be also employed. The tubular silver halide grains can be easily prepared by processes described in Gutoff, "Photographic Science and Engineering, Vol. 14, pp. 248–257 (1970)", U.S. Pat. Nos. 4,434,226, 4,414,310, 4,433,048 and 4,439,520, and U.K. Patent No. 2,112,157.

As for the crystal structure of the silver halide grains, the individual grains may have a homogeneous halogen composition or a heterogeneous halogen composition in which the composition varies from the outer surface portion to the inside portion, or may be a multi-layer structure. Otherwise, the silver halide grains may be bonded with other silver halide grains having different halogen composition through epitaxial bonding, or may be bonded with compounds other than the silver halide such as silver rhodanate and lead oxide. Two or more kinds of silver halide grains which differ in halogen composition, crystal habit, grain size, and/or other features from each other can be employed in combination.

The silver halide photographic emulsions employable in the light-sensitive material of the invention can be prepared by processes described, for example, in "Research Disclosure (RD), No. 17,643, pp. 22–23 (December 1978), (Emulsion preparation and types) and No. 18,716, p. 648.

The silver halide emulsion is generally used after subjecting it to physical ripening, chemical ripening and spectral sensitization. Various additives employable in those stages are described in Research Disclosure, No. 17,643 and No. 18,716. The relevant parts in the literature are described below in the form of a table.

Conventional photographic additives employable in the invention are also described in the above-mentioned Research Disclosure, and the relevant parts in the literature are also shown in the following table.

| Additives | RD 17,643 | RD 18,716 |
| --- | --- | --- |
| Chemical sensitizing agent | p. 23 | p. 648 (right side) |
| Sensitivity-increasing agent | | p. 648 (right side) |
| Spectral sensitizing agent and Supersensitizing agent | p. 23–24 | p. 648 (right side)-p. 649 (right side) |
| Anti-fogging agent and Stabilizer | p. 24–25 | p.649 (right side) |

It is preferred to use silver halide grains having a relatively low fogging value.

For uniformly incorporating the silver halide into microcapsules, a copolymer composed of a hydrophilic repeating unit and a hydrophobic repeating unit is preferably dissolved in the polymerizable compound.

The reducing agent employable in the light-sensitive material of the invention has a function of reducing the silver halide and/or a function of accelerating (or restraining) polymerization of the polymerizable compound. There are known various reducing agents having the abovementioned functions. Examples of such reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6 aminopyrimidines, reductones, aminoreductones, o- or p-sulfonamidophenols, o- or p-sulfonamidonaphthols, 2,4-disulfonamidophenols, 2,4-disulfonamidonaphthols, o- or p-acyl aminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

By adjusting the kind, amount of the above reducing agent, the polymerizable compound can be polymerized within the area where a latent image of the silver halide has been formed or has not been formed. In a system wherein the polymerizable compound is polymerized within the area where a latent image of the silver halide has not been formed, 1-phenyl-3-pyrazolidones, hydroquinones and sufonamidophenols are particularly preferred as the reducing agent.

Various reducing agents having the above-mentioned functions (including compounds referred to as developing agent, hydrazine derivative) are described in T. James, "The Theory of the Photographic Process", 4th edition, pp. 15 291.334 (1977), Research Disclosure Vol. 170, No. 17029, pp. 9.15 (June 1978), and Research Disclosure Vol. 176, No. 7643, pp. 22–31 (December 1978). Further, there can be also employed a reducing agent precursor capable of releasing a reducing agent under heating or in contact with a base. Also in the light-sensitive material of the invention, various reducing agents and reducing agent precursors can be effectively employed. Thus, "the reducing agent(s)" in the present specification means to include all of the reducing agents and reducing agent precursors described in the publications.

The reducing agent having a basic nature can be used in the form of a salt with an appropriate acid. The reducing agents can be used singly or in combination. In the case that two or more reducing agents are used in combination, certain interactions between the reducing agents may be expected. One of the interactions is for acceleration of reduction of silver halide (and/or an organic silver salt) through so-called super-additivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Concrete examples of the above-mentioned reducing agents are as follows.

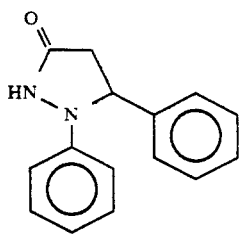 (1)

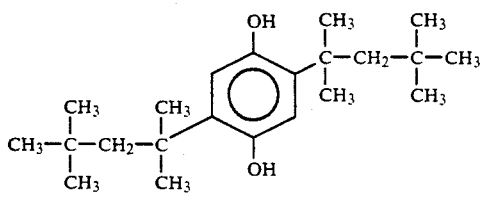 (2)

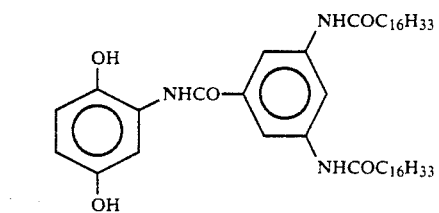 (3)

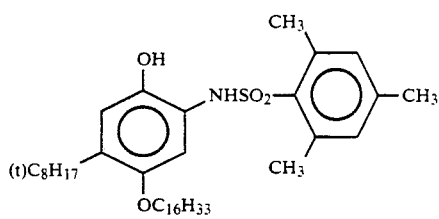 (4)

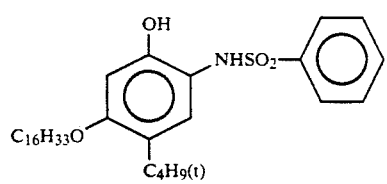 (5)

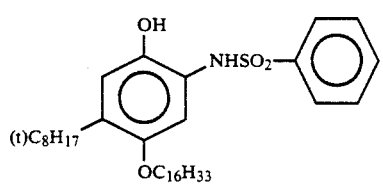 (6)

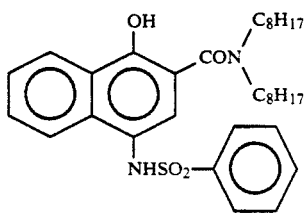 (7)

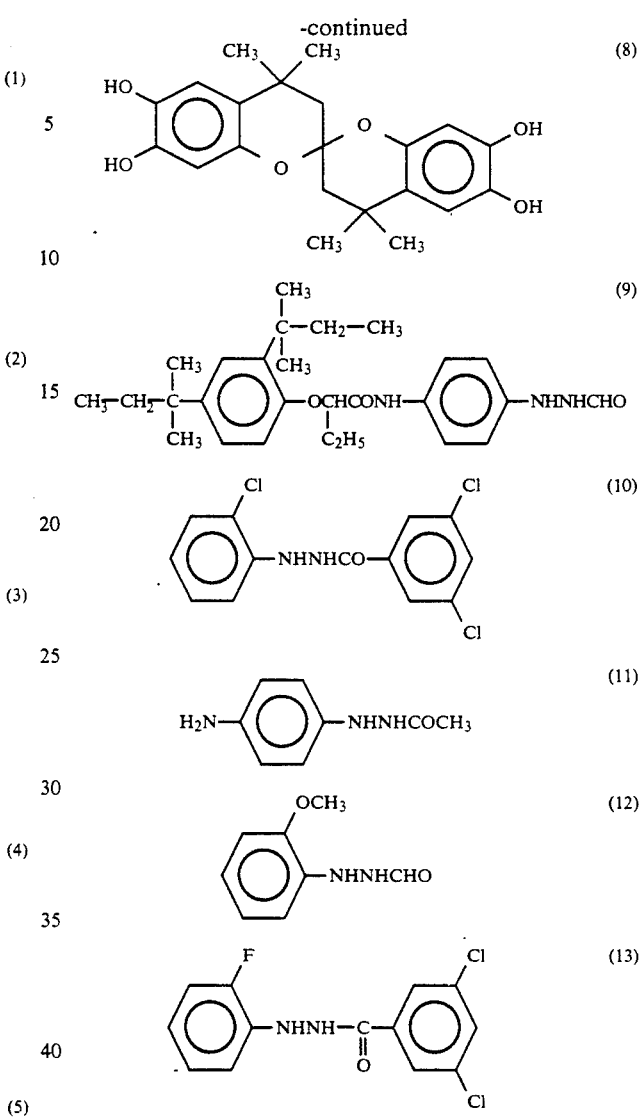

The reducing agent can be used in the light-sensitive material in an amount of wide range, but generally the amount thereof is in the range of 0.1 to 1,500 mole %, preferably in the range of 10 to 300 mole %, based on the amount of the silver salt.

There is no specific limitation with respect to the color image forming substance, and various kinds of substances are available. Examples of the color image forming substance include colored substance (i.e., dyes and pigments) and non-colored or almost non-colored substance (i.e., color former or dye. or pigment precursor) which develops to give a color by an external energy (e.g., heating, pressing or light irradiation) or by other components (i.e., color developer).

In the present invention, the color image forming substance preferably is a colored substance such as a dye or a pigment. A pigment is particularly preferred.

As the pigment used in the invention, there can be mentioned not only those commercially available but also those described in various literatures such as "Handbook of Color Index (C. I.)", Nippon Ganryo Gijutsu Kyokai (ed.), "New Handbook of Pigments (1977)", CMC Shuppan (ed.), "New Application and Technique of Dyes (1986)", and CMC Shuppan (ed.), "Printing Ink Technique (1984)".

The pigments can be classified based on the color difference into white pigment, black pigment, yellow pigment, orange pigment, brown pigment, red pigment, violet pigment, blue pigment, green pigment, fluorescent pigment, metallic powder pigment, and polymeric linking dyestuff. Examples of a pigment include insoluble azo pigment, azolake pigment, condensed azo pigment, chelate azo pigment, phthalocyanine pigment, anthraquinone pigment, perylene and perynone pigment, thioindigo pigment, quinacridone pigment, dioxadine pigment, isoindolinone pigment, quinophthalone pigment, color lake pigment, azine pigment, nitroso pigment, nitro pigment, natural pigment, fluorescent pigment and inorganic pigment.

The pigment particles are preferably surface treated to be lipophilic. The methods of surface treatment include a method having the step of coating with a resin or a wax, a method having the step of attaching of a surface active agent or a method having the step of connecting an active substance (e.g., a silane coupling agent, an epoxy compound and polyisocyanate) onto the surface of the pigment. The methods are disclosed in "Nature and Application of Metallic Soap", Saiwai Shobo (ed.); "Printing Ink Technique", CMC Shuppan (ed. 1984); and "New Application and Technique of Pigment", CMC Shuppan (ed. 1986).

The diameter of the pigment particles preferably is in the range of 0.01 to 10 μm, more preferably 0.05 to 1 μm in the measurement after the particles are dispersed in the polymerizable compound.

The pigment is preferably used in an amount of 5 to 60 parts by weight, based on 100 parts by weight of the polymerizable compound. The pigment particles can be dispersed in the same manner as in a known dispersing technique such as preparation of ink or toner. Various dispersing devices are available. Examples of the dispersing device include a sand mill, an attritor, a pearl mill, a supermill, a ball mill, an impeller, a disperser, a KD mill, a colloid mill, a dynatron, a three-rolls mill and a pressure kneader. The dispersing devices are described in "New Application and Technique of Pigment", CMC Shuppan (ed. 1986).

The polymerizable compounds used in the light-sensitive material are compounds having an ethylenically unsaturated group.

Examples of the compounds having an ethylenic unsaturated group which can be used for the light-sensitive material include acrylic acids, salts of acrylic acids, acrylic esters, acrylamides, methacrylic acid, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyl acrylate, nonylphenyloxyethyl acrylate, 1,3-dioxolan acrylate, hexanediol diacrylate, butanediol diacrylate, neopentylglycol diacrylate, tricyclodecandimethylol diacrylate, trimethylolpropane triacrylate, pentaerythritol tetraacrylate, dipentaerythritol pentaacrylate, dipentaerythritol hexacrylate, diacrylate of polyoxyethylenated bisphenol A, 2 (2-hydroxy-1,1-dimethylethyl) 5-hydroxymethyl-5-ethyl-1,3-dioxane diacrylate, (2-hydroxy-1,1-dimethylethyl) 5,5-dihydroxymethyl-1,3-dioxane triacrylate, triacrylate of propyleneoxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate and dimethacrylate of polyoxyalkylenated bisphenol A.

The polymerizable compounds can be used singly or in combination of two or more compounds. Further, polymerizable compounds in which a polymerizable functional group such as a vinyl group or a vinylidene group is introduced into a chemical structure of the above-described reducing agent can be also employed as the polymerizable compound.

The base precursor used in the present invention includes various inorganic or organic compounds, and is classified into decarboxylation type, thermal decomposition type, reaction type and complex salt-formation type.

The base precursor preferably is a salt of an organic base and an acid which decarboxylates under heating or a compound which release a base under heating.

The base precursor used in the invention preferably releases a base at a temperature in the range of 50° C. to 200° C., and more preferably 80° C. to 180° C.

The base precursor preferably has a solubility in water of not more than 1% at 25° C. to be incorporated into microcapsules.

A preferred base precursor is composed of a salt of an organic base with a carboxylic acid. The organic base preferably is a diacidic, triacidic or tetraacidic base which composed of two to four amidine or guanidine moieties and at least one residue of a hydrocarbon or a heterocyclic ring as a linking group of the amidine or guanidine moieties.

The amidine moiety corresponds to an atomic group formed by removing one or two hydrogen atoms from the compound having the formula (I).

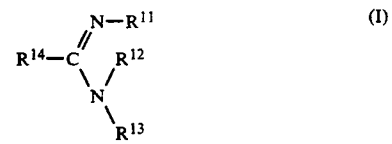

In the formula (I), each of $R^{11}$, $R^{12}$, $R^{13}$ and $R^{14}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent group; and any two of $R^{11}$, $R^{12}$, $R^{13}$ and $R^{14}$ may be combined together to form a five-membered or six-membered nitrogen containing heterocyclic ring.

The guanidine moiety corresponds to an atomic group formed by removing one or two hydrogen atoms from the compound having the formula (II).

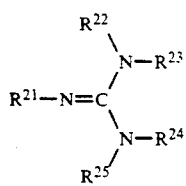
(II)

In the formula (II, each of $R^{21}$, $R^{22}$, $R^{23}$, $R^{24}$ and $R^{25}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent group; and any two of $R^{21}$, $R^{22}$, $R^{23}$, $R^{24}$ and $R^{25}$ may be combined together to form or six-membered nitrogen-containing heterocyclic ring.

Examples of the base precursor are shown below.

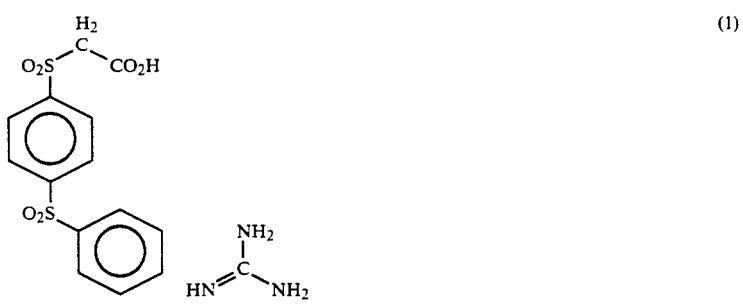
(1)

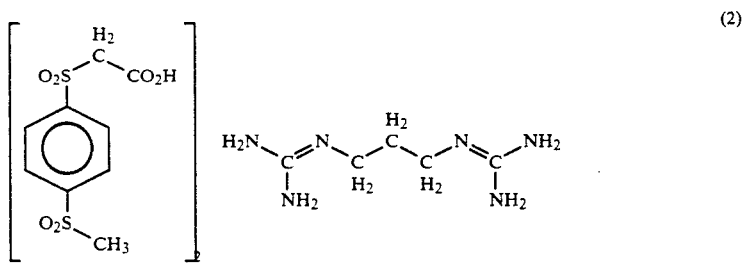
(2)

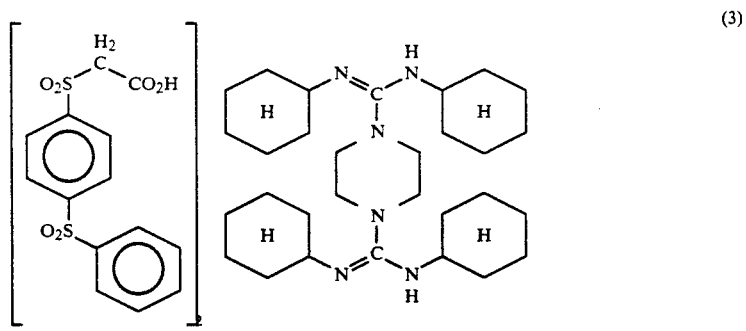
(3)

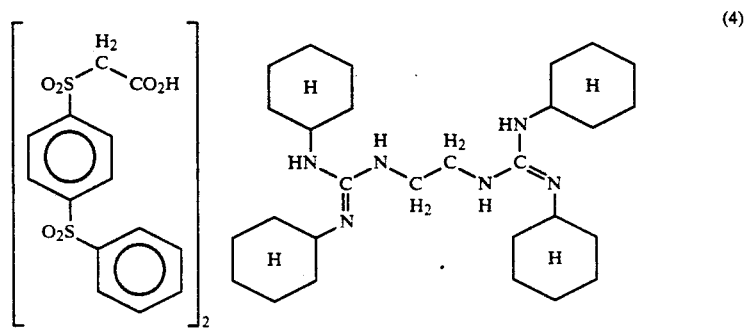
(4)

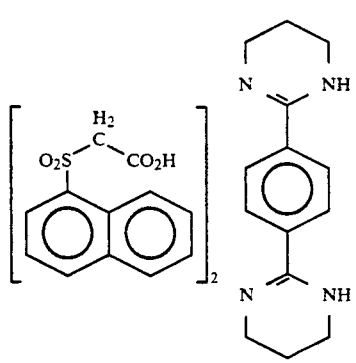
(5)
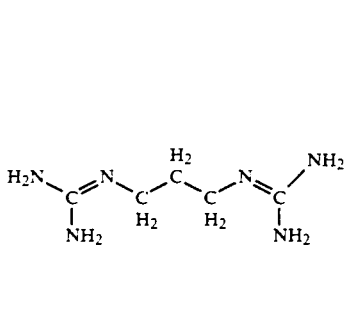
(6)
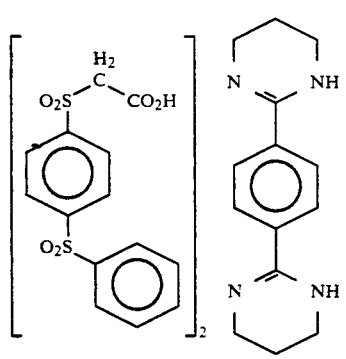
(7)
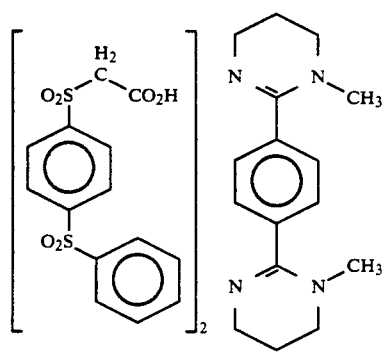
(8)

-continued

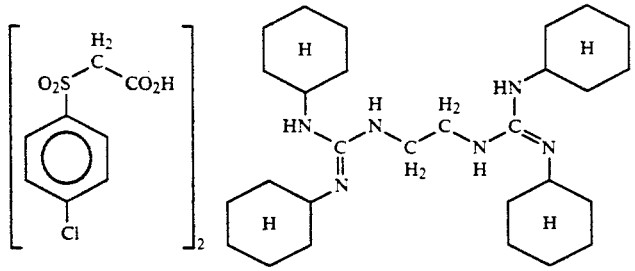

(9)

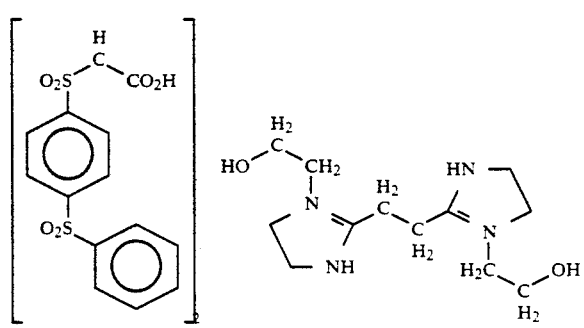

(10)

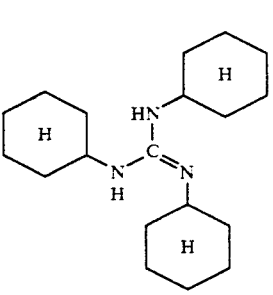

(11)

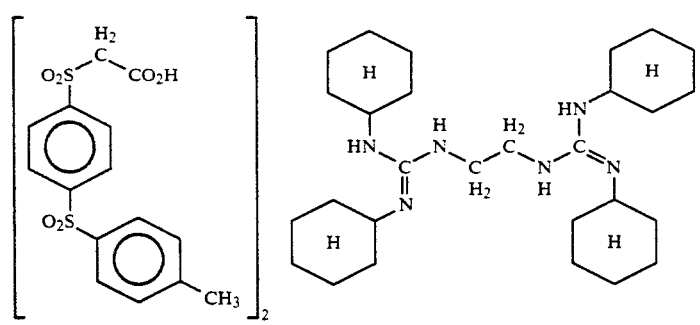

(12)

In the second embodiment of the present invention, a photopolymerization initiator is contained in microcapsules in place of the silver halide and the reducing agent.

Examples of the photopolymerization initiators include α-alkoxyphenyl ketones, polycyclic quinones, benzophenones and substituted benzophenones, xanthones, thioxanthones, halogenated compounds (e.g., chlorosulfonyl and chloromethyl polycyclic aromatic compounds, chlorosulfonyl and chloromethyl heterocyclic compounds, chlorosulfonyl and chloromethyl benzophenones, and chlorosulfonyl and chloromethyl fluorenones), haloalkanes, α-halo-αphenylacetophenones, photo-reducing dye reducing redox couples, halogenated paraffins (e.g., brominated or chlorinated paraffin), benzoalkyl ethers, rofindimer-mercapto compound couples and organic boron compound anionic salts of organic cationic compounds.

Preferred examples of the photopolymerization initiators include benzoisobutyl, 2,2-dimethoxy-2-phenylacetophenone, 9,10-anthraquinone, benzophenone, Michler's ketone, 4,4,-diethylaminobenzophenone, xanthone, chloroxanthone, thioxanthone, chlorothioxanthone, 2,4-diethylthioxanthone, chlorosulfonylthioxanthone, chlorosulfonylanthraquinone, chloromethylanthraquinone, chloromethylbenzothiazole, chlorosulfonylbenzoxazole, chloromethylquinoline, chloromethylbenzophenone, chlorosulfonylbenzophenone, fluorenone, carbon tetrabromide, benzoisobutylether, benzoynisopropylether and combination of 2,2,-bis(o-chlorophenyl)-4,4,'5,5'-tetraphenylbiimidazole and 2-mercapto 5-methylthio-1,3,4-thiadiazole.

As the photopolymerization initiator, the above-mentioned compounds can be used singly or in combination of two or more kinds.

In the second embodiment of the invention, the photopolymerization initiator is preferably used in an amount of 0.5 to 30% by weight, more preferably 2 to 20% by weight, based on the amount of the polymerizable compound. There is no specific limitation on the preparation of microcapsules, and any known processes can be employed. Examples of the processes for preparing microcapsules include a process utilizing coacervation of hydrophilic wallforming materials (U.S. Pat. Nos. 2,800,457 and 2,800,458); an interfacial polymerization process (U.S. Pat. No. 3,287,154, U.K. Patent No. 990,443, and Japanese Patent Publications No. 38(1963)-19574, No. 42(1967) 446 and No. 42(1967)-771); a process utilizing precipitation of polymers (U.S. Pat. Nos. 3,418,250 and 3,660,304); a process of using isocyanate-polyol wall-materials (U.S. Pat. No. 3,796,669); a process of using isocyanate wall-materials (U.S. Pat. No. 3,914,511); and a process of using aminoaldehyde resins (U.S. Pat. Nos. 4,001,140, 4,087,376, 4,089,802 and 4,025,455, and Japanese Patent Provisional Publications No. 62(1987)-209439, No. 64(1989)-91131 and No. 1(1989)-154140).

Examples of the amino-aldehyde resins include an urea-formaldehyde resin, an urea-formaldehyde-resorcinol resin, a melamine-formaldehyde resin, an acetoguanamine-formaldehyde resin and a benzoguanamine-formaldehyde resin. Further, examples of the processes for preparing microcapsules include an in situ process utilizing polymerization of monomers (Japanese Patent Publication No. 36(1961)-9168 and Japanese Patent Provisional Publication No. 51(1976) 9079); a polymerization dispersing and cooling process (U.K. Patents No. 927,807 and No. 965,074); and a spray-drying process (U.S. Pat. No. 3,111,407 and U.K. Patent No. 930,422).

A process for encapsulating oily droplets of the polymerizable compound is not limited to the above-mentioned ones, but a process of emulsifying core materials and then forming a polymeric membrane as a microcapsule shell over the core material is particularly preferred. Examples of the shell material include a polyamide resin and/or a polyester resin, a polyurea resin and/or a polyurethane resin, gelatin, an epoxy resin, a complex resin containing a polyamide resin and a polyurea resin, a complex resin containing a polyurethane resin and a polyester resin. A melamine-formaldehyde resin, of which fine microcapsules can be made, is particularly preferred in the invention.

The microcapsule having a polymer shell of a polymeric compound around a film composed of a reaction product of a water-soluble polymer having a sulfinyl group and a polymerizable compound having an ethylenic unsaturated group is preferred.

In the case that aminoaldehyde resins are used for microcapsules, the amount of residual aldehyde is preferably regulated to be below a certain value.

A mean grain size of microcapsules is preferably within the range of 3 to 20 μm. It is preferred that the grain sizes of microcapsules be homogeneously dispersed in the range above a certain value. The ratio between the thickness and the grain size of a microcapsule is preferably within a certain range.

In the case that a silver halide is contained in microcapsules, the above-described mean grain size of the silver halide is preferably not more than one fifth of the mean grain size of microcapsules, and more preferably it is not more than one tenth. A homogeneous and smooth image can be obtained by regulating the mean grain size of the silver halide not to be more than one fifth of the mean grain size of microcapsules.

In the case that a silver halide is contained in microcapsules, the silver halide is preferably contained within the shell of the microcapsule.

In preparation of the microcapsules, a base precursor can be directly dispersed in a polymerizable compound. However, it is particularly preferred that a base precursor is dispersed in water, and the dispersion is then emulsified in a polymerizable compound. In this case, a nonionic or amphoteric water soluble polymer is preferably dissolved in water in which the base precursor is dispersed.

Examples of the nonionic water soluble polymer include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methyl cellulose. An example of the amphoteric water soluble polymer is gelatin.

The water soluble polymer is preferably used in an amount of 0.1 to 100 weight % based on the amount of the base precursor, and more preferably 1 to 50 weight %. The base precursor is preferably contained in the dispersion in an amount of 5 to 60 weight %, and more preferably of 10 to 50 weight %. The base precursor is preferably used in an amount of 2 to 50 weight % based on the amount of the polymerizable compound, and more preferably 5 to 30 weight %.

When a shell of a microcapsule is formed by dispersing an oily liquid containing a base precursor to an aqueous medium in the process for preparing the light-sensitive microcapsules, a nonionic or anionic water soluble polymer is preferably contained in the aqueous medium. The amount of oily liquid is preferably within the range of 10 to 120 weight. %, more preferably 20 to 90 weight. %, based on the amount of the aqueous medium.

Examples of the nonionic water soluble polymer include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methyl cellulose. Examples of the anionic water soluble polymer include polystyrenesulfinic acid, a salt of a copolymer of styrenesulfinic acid, a salt of polystyrenesulfonic acid, a copolymer of styrenesulfonic acid, a salt of polyvinyl sulfate, a salt of polyvinylsulfonic acid, a copolymer of maleic anhydride and styrene, and a copolymer of maleic an hydride and isobutylene.

The aqueous medium preferably contains the anionic water soluble polymer in an amount of 0.01 to 5 weight %, and more preferably 0.1 to 2 weight %. It is particularly preferred to use a water soluble polymer having a few sulfinic groups together with a nonionic water soluble polymer. A hydrophilic compound is preferably dissolved in a polymerizable compound to reduce the solubility of the base precursor in the polymerizable compound. Examples of the hydrophilic group of the compound include —OH, —SO$_2$NH$_2$, —CONH$_2$ and —NHCONH$_2$. Examples of the hydrophilic compound include polyethylene glycol, polypropylene glycol, benzoic amide, cyclohexylurea, octyl alcohol, dodecyl alcohol, stearyl alcohol and stearamide.

Examples of the materials used for the preparation of the support include glasses, ordinary papers, fine paper, coat paper, cast-coat paper, synthetic papers, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

A polymer film support is particularly preferred. The thickness of the polymer film is preferably not more than 50 μm for the efficiency of heat conduction because the light-sensitive material is preferably heated from the side of the support.

In the image formation, the light-sensitive material may be imagewise exposed to light, heated and pressed on an image receiving material. Accordingly, the light-sensitive material is preferably in the form of a roll film for these continuous operations. The light-sensitive material in the form of the roll film should have a sufficient mechanical strength and heat conduction fro these continuous operations. Therefore, a polymer film support is preferably used, since the polymer film has a sufficient mechanical strength (such as tensile strength, elasticity and hardness). The thickness of the polymer film is preferably not more than 50 μm as is mentioned above. If the thickness is more than 50 μm, the efficiency of heat conduction is lowered and a long development time is required. The thickness of the polymer film is preferably not less than 10 μm, since the mechanical strength of the film is lowered when the film has a thickness of less than 10 μm.

An undercoating layer is preferably provided on the polymer support. A metal (e.g., aluminum) film is also preferably evaporated onto the polymer support. A polymer film having a thickness of not more than 50 μm onto which an aluminum film is evaporated is a particularly preferred support of the present invention.

Optionally employable components contained in a light sensitive layer and optional layers included in a light-sensitive material are described below. The binder employable for the light-sensitive material can be included in the light-sensitive layer singly or in combination. A water-soluble binder is preferably employed. A typical water-soluble binder is transparent or semi-transparent one, of which examples include natural substances such as gelatin, gelatine derivatives, cellulose derivatives, starch and gum arabic; and synthetic polymer substances such as polyvinyl alcohol, polyvinyl pyrrolidone and water-soluble polyvinyl compound (e.g., acrylamide polymer). One of the other examples of synthetic polymer substances is a dispersing polyvinyl compound which increases the size-stability of photographic materials in form of latex.

An organometalic salt can be used as an oxidizing agent in combination with silver halide in the invention. An organic silver salt is most preferably employed. Examples of an organic compound employable for forming such organosilver salt oxidizing agent include benzotriazoles, aliphatic acids and other compounds described in U.S Pat. No. 4,500,626 (columns 52–53). Also effectively employable are silver salts of carboxylic acids having alkynyl group (e.g., silver phenylpropionate) and acetylene silver salt. The organic silver salts can be used singly or in combination of two or more kinds.

The above-mentioned organic silver salt can be used in combination with a light-sensitive silver halide in an amount of 0.01 to 10 mole, preferably 0.01 to 1 mole, per 1 mole of the silver halide. The total amount of the organic silver salt and the silver halide is generally within a range of 1 mg/m$^2$ to 10 g/m$^2$ in terms of the amount of silver metal.

The antismudging agent employable for the light-sensitive material is preferably used in form of solid grains at room temperature. Concrete examples of the antismudging agent employable for the light-sensitive material include starch grains described in U.K. Patent No. 1,232,347, fine powder of polymer U.S. Pat. No. 3,625,347, microcapsules containing no color developing agent described in U.K. Patent No. 1,235,991, fine powder of cellulose described in U.S. Pat. No. 2,711,357 and inorganic grains such as talc, kaolin, bentonite, pagodite, zinc oxide, titanium oxide, alumina. A mean grain size of the above-mentioned grains is preferably within the range of 3 to 50 μm, more preferably 5 to 40 μm, in terms of volume mean diameter. It is effective that the size of the grain is larger than that of the microcapsule.

Various image formation accelerators is employable for the light-sensitive material.

Image formation accelerators have the functions such as 1) accelerating the transfer of a base or a base precursor, 2) accelerating the reaction of a reducing agent and a silver salt, 3) accelerating the passivating reaction of coloring substances by polymerization. From a viewpoint of physical chemistry concerning the functions, the image formation accelerators can be classified into base or base precursor nucleophilic compounds, oils, heat solvents, surface active agents, compounds having interactions with silver or silver salts, compounds having deoxidization function and other compounds. However, these substances generally have complex functions, so each of them usually has some acceleration effects described above. In the system wherein the polymerizable compound is polymerized within the area where a latent image of silver halide is not formed, a thermal polymerization initiator or a photopolymerization initiator may be contained in the light-sensitive layer. Further, the thermal polymerization initiator or the photopolymerization initiator may also be contained in the image-receiving material to harden the transferred image.

Examples of the thermal polymerization initiator include azo compounds, organic peroxides, inorganic peroxides and sulfinic acids. The thermal polymerization initiator is described in "Addition Polymerization and Ring Opening Polymerization", pp.6–18, edited by the Editorial Committee of High Polymer Experimental Study of the High Polymer Institute, published by Kyoritsu Shuppan (1983).

Examples of the photopolymerization initiator include benzophenones, acetophenones, benzoins and thioxanthones. The photopolymerization initiator is described in "Ultraviolet Ray Hardening System", pp.63–147, edited by the General Technical Center (1989).

Various surface active agents are employable for the light-sensitive material for various purpose, such as aiding the coating process, increasing facility of peeling off, increasing slipperiness, preventing electrification and accelerating development.

An antistatic agent is employable for the light-sensitive materials in order to prevent electrifying. Antistatic agents are described in Research Disclosure Vol. 176, No. 17643, pp. 27 (November 1978).

In order to prevent halation and irradiation, a dye or a pigment may be added to the light-sensitive layer of the light-sensitive materials.

The microcapsules may contain a coloring matter having a property of being decolored by heating or irradiation with light. The coloring matter having a property of being decolored by heating or irradiation with light can play the role corresponding to yellow filter in the conventional silver salt photography system.

In the case that a solvent of a polymerizable compound is used for the light-sensitive material, the solvent is preferably contained in microcapsules other than those containing polymerizable compound. Silver halide grains adsorbing water soluble vinyl polymer can also be employed.

Various development terminators can be employable for the light-sensitive materials in order to obtain an image of constant quality independent of the temperature and the process of development treatment.

In the specification, "a development terminator" means a compound which interacts with silver or silver salts to inhibit the development, or a compound which neutralizes or reacts with a base to reduce the base concentration in order to terminate the development. Concrete examples of a development terminator include a acid precursor which emits an acid by heating, an electrophilic compound which substitutes a chlorine atom existing together with by heating, a nitrogen including heterocyclic compound, a mercapto compound and a precursor thereof.

Examples of an optional layer provided in a light-sensitive material include an image-receiving layer, a heating layer, an anti-electrifying layer, an anti-curling layer, a peeling layer, a cover sheet or a protective layer, a layer containing a base or a base precursor, a layer of base barrier and an anti-halation layer (a coloring layer). When the light-sensitive material is used, the image may be formed on the above-mentioned image-receiving layer provided on the light-sensitive material, instead of using an image-receiving material (described later). An image-receiving layer provided on the light-sensitive material can have the same constitution as that on an image-receiving material. The detail of the image-receiving layer is described below.

In the image formation using the light-sensitive material, an image can be formed on an image-receiving material. The image-receiving material is described below.

The image-receiving material may comprise a support alone. However, an image-receiving layer is preferably provided on the support.

Examples of the materials used for the preparation of the support of the image-receiving material include glasses, ordinary papers, fine paper, baryta paper, coat paper, cast-coat paper, synthetic papers, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene). In the case that a porous material such as paper is used as a support of an image-receiving material, the surface of the material preferably has a certain smoothness.

The image-receiving layer of an image-receiving material comprises a white pigment, a binder and other additives. Examples of the white pigment employable for an image-receiving layer include inorganic white pigments such as oxides (e.g., silicon oxide, titanium oxide, zinc oxide, magnesium oxide and aluminium oxide), salts of alkaline earth metals (magnesium sulfate, barium sulfate, calcium sulfate, magnesium carbonate, barium carbonate, calcium carbonate, calcium silicate, magnesium hydroxide, magnesium phosphate and magnesium hydrogenphosphate), aluminium silicate, aluminum hydroxide, zinc sulfide, various kinds of clay, talc, kaolin, zeolite, acid clay, soluble clay and glass; organic white pigments such as polyethylene, polystyrene, benzoguanamine resin, urea-formalin resin, melamine-formalin resin and polyamide resin. The white pigment above-described can be used in the invention singly or in combination. A white pigment which can absorb a high amount of a polymerizable compound is preferably used.

The mean grain size of the white pigment is within a range of 0.1 to 20 μm, preferably 0.1 to 10 μm. The amount of the pigment is in the range of 0.1 to 60 g, preferably 0.5 to 30 g. The weight ratio of the white pigment to a binder preferably is in the range of 0.01 to 0.4, and more preferably 0.03 to 0.3.

As the binder, a water-soluble polymer, a polymer latex and a polymer soluble in an organic solvent are employed.

Examples of the water-soluble polymer include cellulose derivatives such as carboxymethylcellulose, hydroxyethylcellulose and methylcellulose; proteins such as gelatin, phthalated gelatin, casein and egg albumin; starch and its derivatives such as dextrin and etherificated starch; synthetic polymers such as polyvinyl alcohol, partial acetal of polyvinyl alcohol, poly-N-vinyl pyrolidone, polyacrylic acid, polymethacrylic acid, polyacrylamide, polyvinyl imidazole, polyvinyl pirazole and polystyrenesulfonic acid; and others such as locust bean gum, pullulan, gum arabic and sodium alginate.

Examples of the polymer latex include styrene-butadiene copolymer latex, methyl methacrylate-butadiene copolymer latex, polyacrylate latex, polymethacrylate latex, acrylate-methacrylate copolymer latex and ethylene-vinyl acetate copolymer latex.

Examples of the polymer soluble in an organic solvent include polyester resin, polyurethane resin, polyvinyl chloride resin and polyacrylonitrile resin.

The binders can be used singly or in combination. A combination of two or more binders can be employed to cause a phase separation in the image recording layer.

The image-receiving layer may further contain various components other than the white pigment and the binder.

For example, a color developer can be contained in the image-receiving layer in the case that a color formation system using a color former and the color developer is used. Examples of the color developer include phenols, organic acids and salts, and esters. Zinc salt of an salicylic acid derivative is preferred in the case that a leuco dye is used as a color image forming substance (color former). 3,5-di-α-methylbenzylsalicylic acid is particularly preferred.

The color developer is preferably contained in the im. age-receiving layer in a coating amount of 0.1 to 50 g/m$^2$, and more preferably 0.5 to 20 g/m$^2$.

A thermoplastic compound may be contained in the image recording layer. In the case that the thermoplastic compound is contained in the image recording layer, the image recording layer itself is preferably composed of an agglomerate of fine particles of the thermoplastic compound (i.e., granular thermoplastic compound). The image recording layer having this constitute has such advantages that the formation of a transferred image can be readily done and a glossy image can be obtained under heating after the image formation. There is no specific limitation on the thermoplastic compounds, and any known thermoplastic resins (plastics) and waxes can be employed. The glass transition point of the thermoplastic resin or the melting point of the wax preferably is not higher than 200° C. A photopolymerization initiator or a thermal polymerization initiator may be contained in the image recording layer. The photopolymerization initiator or the thermal polymerization initiator can be incorporated into the image recording layer to cure the unpolymerized polymerizable compound.

The image formation using the light-sensitive material is described below.

Various exposure means can be employed in the imagewise exposure, and in general, the light-sensitive material is imagewise exposed to a radiation to obtain a latent image of the silver halide. The kind of light source or the amount of light employed in the exposure can be selected depending on a light-sensitive wavelength (or intensified wavelength in the case of spectral sensitization) of the silver halide and a sensitivity of the light-sensitive material.

The examples of the radiation include natural light, ultraviolet light, visible light and infrared light. A high energy radiation such as X-ray, $\gamma$-ray and electron beam is also available. However, the light source does not need to be high energy. Examples of the light source include a fluorescent lamp, a tungsten lamp, a halogen lamp, a xenon flash lamp, various lasers (e.g., a gas laser, a solid laser, a chemical laser and a semiconductor laser), a light emission diode, a plasma emitting tube and FOT.

In the case that a full color image is formed, the light-sensitive material contains two or more microcapsules which are different from each other with respect to the spectral sensitivity. Accordingly, the light-sensitive material is exposed to two or more spectral lights to form a full color image. In this case, a light source emitting two or more lights is available. Further, a combination of two or more monochromatic light sources is also available.

The light source should be selected in consideration of the light-sensitive wavelength as is mentioned above. Further, it is preferably considered whether the image information is an electrical signal or not (digital or analog). The processing speed of the system, the size of the image recording apparatus and the electric power of the apparatus are also important factors of the light source.

In the case that the image information is not an electrical signal, a subject such as a landscape, a portrait is directly photographed, an original image is directly copied, or a positive such as a reversal film is exposed to light. In this case, exposure devices for a camera, a printer, an enlarging apparatus and a copying machine are available. A two-dimensional image can be exposed to light by one shot using these exposure device. Further, the image can also be scanned through a slit. An original image can be enlarged or reduced. In this case, a fluorescent lamp or a tungsten lamp is a preferred light source. However, a monochromatic light such as a laser is also available where two ore more light are used in combination. In the case that the image information is an electrical signal, two or more monochromatic lights such as a light emission diode or a laser can be used in combination as a light source. The combination is determined in consideration of the spectral sensitivity of the light-sensitive material. Further, various display devices (CRT, liquid crystal display, electroluminescence display, electrochromic display and plasma display) are also available. In this case, the image information is an image signal such as a obtained by a video camera or an electron still camera, a television signal, a signal obtained by scanning an original image, and a signal stored in a recording material such as a magnetic tape or disk.

In the case of the exposure of a color image, two or more monochromatic lights are used in combination in consideration of the spectral sensitivity of the light-sensitive material. In this case, two or more light sources such as LED, a laser and a fluorescent lamp may be used in combination. The spectral sensitivity of the light-sensitive material usually contains R (Red), G (Green) and B (Blue). Light sources of UV (Ultraviolet) and IR (Infrared) have also recently been available. In addition to the combination of R, G and B, examples of the combination of the spectral sensitivity include (G, R, IR), (R, short wave IR, long wave IR), (short wave UV, medium wave UV, long wave UV) and (UV, B, G). A combination of different light sources such as two kinds of LED and a laser is available. A light emitting tube or element can be used in a scanning exposure with respect to individual colors. Arrays such as a LED array, a liquid crystal shutter array and a magneto-optical element shutter array can be used to increase the speed of the exposure.

The display devices such as CRT include a monochromatic device and a color device. The monochromatic device may form a color image in the case that a filter and a multiple exposure are employed. A conventional two-dimensional display device can be used as a one-dimensional device such as FOT. In the case that the display device and a scanner are used in combination, the displayed image can be divided into two or more parts.

In the second embodiment of the present invention using a photopolymerization initiator, a polymerizable compound is polymerized by the initiator within the exposed are.

In the first embodiment of the invention using silver halide and a reducing agent, the light-sensitive material is heated simultaneously with or after imagewise exposure. The light-sensitive material is preferably heated from the side of the support.

Heating in the heat development process can be conducted in various known manners. For example, a heating layer which is arranged on the light-sensitive material can be used as the heating means. Further, the light-sensitive material can be heated on a hot plate, an iron or a heat roller. Furthermore, the material can be heated between a heat roller and a belt.

The whole surface of the light-sensitive material can be heated by a heater which is larger than the light-sensitive material. The light-sensitive material can also be heated by scanning the material with a small heater (e.g., hot plate, heat roller, heat drum).

Further, the light-sensitive material can be heated though the material is not in contact with a heater. For example, the light-sensitive material may be heated with an electromagnetic wave, an infrared ray or a hot air.

In the case that the light-sensitive material is heated from the side of the support, the side of the light sensitive layer is usually open to the air. However, the side of the layer may be covered with an adiabatic material to maintain the heating temperature. In this case, it is necessary to carefully handle the adiabatic material. If the adiabatic material is pressed on the light-sensitive material at a high pressure (10 kg/cm² or more), the microcapsules contained in the light-sensitive layer tend to be ruptured.

After the light-sensitive material is imagewise exposed to light, the light-sensitive material is heated preferably at an interval of 0.1 second or more. The heating time is preferably in the range of 0.1 to 5 seconds, and more preferably in the range of 0.1 to 3 seconds. The heating temperature usually ranges from 60° C. to 250° C., preferably from 80° C. to 180° C.

In the above-described heat development process, the polymerizable compound is polymerized within the area where a latent image of the silver halide has been formed or the area where a latent image of the silver halide has not been formed. In the case that a polymerization inhibitor is formed by a reaction of a reducing agent within the area where a latent image of silver halide, the polymerizable compound within the area where a latent image of the silver halide has not been formed is polymerized by a thermal polymerization initiator or a photopolymerization initiator. The thermal polymerization initiator or the photopolymerization initiator is preferably contained in the light-sensitive layer, and more preferably contained in the microcapsules. After the heat development process, the light-sensitive material may be heated in the presence of the thermal polymerization initiator, or irradiated with light in the presence of the photopolymerization initiator.

A color image can be obtained on an image-receiving material by pressing the light-sensitive material on the image-receiving material to transfer the unpolymerized polymerizable compound with the color image forming substance to the image-receiving material.

For applying a pressure to the light-sensitive material and the image-receiving material, any known pressing methods can be employed.

For example, the light-sensitive material and the image-receiving material are sandwiched between press plates such as a presser or transferred using a pressure roller such as a nip roll, to apply a pressure to them. A dot-impact pact device can be also employed to intermittently give a pressure to them. Otherwise, a pressure may be applied to the light-sensitive material and the image-receiving material by spraying a high-pressure air by means of an air gun or using a ultrasonic wave-generating device or a piezoelectric element.

The light-sensitive material and the image-receiving material are preferably pressed at a pressure of not less than 500 kg/cm², and more preferably not less than 800 kg/cm². It is particularly preferred that the materials are pressed while heating. When the materials are heated, an image can be transferred a pressure of not more than 300 kg/cm².

The light-sensitive material of the invention can be used for color photography, printing and copy (e.g., computer-graphic hard copy and xerox copy). The present invention provides a compact and inexpensive image forming system such as a copying machine and a printer.

The present invention is further described by the following examples, but those examples are given by no means to restrict the invention.

EXAMPLE 1

Preparation of Silver Halide Emulsion (EB-1)

In distilled water was added 24 g of limed inert gelatin, and the resulting the mixture was stirred at 40° C. for 1 hour to dissolve gelatin in water. To the solution was added 13 g of sodium chloride. The solution was adjusted to pH 3.2 using 1N sulfuric acid.

To the solution were added the solutions (I) and (II) at 60° C. for 45 minutes keeping pAg of 8.5 by a control double jet method. After the addition, the mixture was adjusted to pH 6.0 using 1N sodium hydroxide. To the mixture were added 4.8 mg of phenol and 480 mg of the sensitizing dye (SB-1). After 20 minutes, to the mixture was added 100 g of aqueous solution containing 4.1 g of potassium iodide at the same feed rate over 3 minutes.

Solution (I)
120 g of AgNO₃ in 550 ml of distilled water
Solution (II)
85 g of KBr in 550 ml of distilled water Sensitizing dye (SB-1)

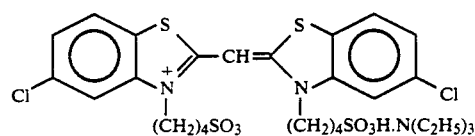

To the emulsion was added 1.1 g of a copolymer of isobutylene/monosodium maleate copolymer for sedimentation. After the emulsion was washed with water for desalting, 6 g of limed gelatin was dissolved in the emulsion. To the emulsion was further added 3 ml of 72% aqueous solution of phenol. The emulsion was adjusted to pH 6.2.

Thus, 550 g of a monodispersed tetradecahedral silver iodobromide emulsion (EB-1) (mean grain size: 0.24 μm, distribution coefficient: 20%) was prepared.

Preparation of Silver Halide Emulsion (EG-1)

A monodispersed silver iodobromide emulsion (EG-1) (yield: 550 g, mean grain size: 0.18 μm, distribution coefficient: 22%) was prepared in the same manner as in preparation of the silver halide emulsion (EB-1) except that the addition time for the solutions (I) and (II) was changed from 45 minutes to 15 minutes and 450 mg of the sensitizing dye (SG-1) was used in place of the sensitizing dye (SB-1).

Sensitizing dye (SG-1)

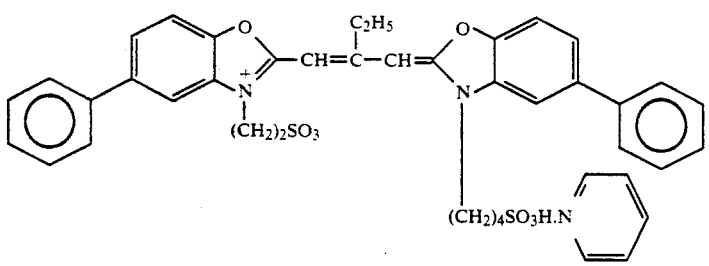

Preparation of Silver Halide Emulsion (ER-1)

A monodispersed silver iodobromide emulsion (ER-1) (yield: 550 g, mean grain size: 0.18 μm, distribution coefficient: 22%) was prepared in the same manner as in preparation of the silver halide emulsion (EG-1) except that 450 mg of the sensitizing dyes (SR-1) and (SR-2) were used in place of the sensitizing dye (SG-1).

Sensitizing dye (SR-1)

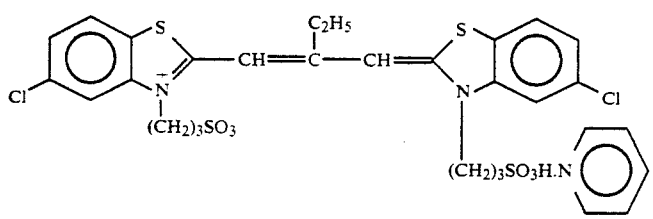

Sensitizing dye (SR-2)

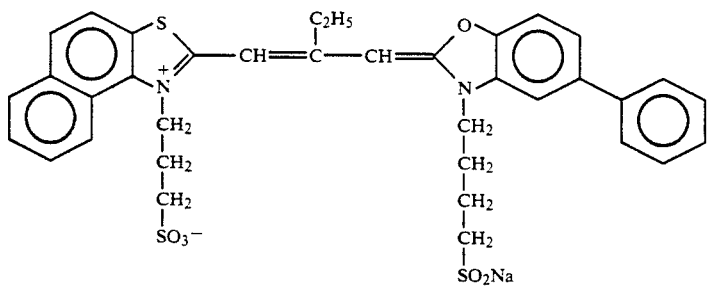

-continued

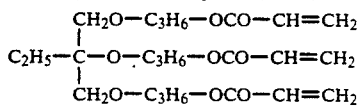

Preparation of solid Dispersion (KB-1)

In a 300 ml dispersion container were placed 110 g of 5.4% aqueous solution of limed gelatin, 20 g of 5% aqueous solution of polyethylene glycol (average molecular weight: 2,000), 70 g of the base precursor (BG-1) and 200 ml of glass beads having diameters in the range of 0.5–0.75 mm. The resulting mixture was stirred at 3,000 r.p.m. for minutes using Dynomill. The mixture was adjusted to pH 6.5 using 2N sulfuric acid to obtain a solid dispersion (KB-1) of the base precursor (43) having a grain size of not more than 1.0 μm.

Base precursor (BG-1)

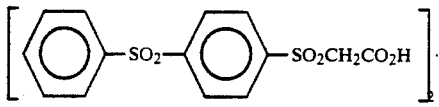

Preparation of Pigment Dispersion (GY-1)

To 255 g of the polymerizable compound (MN-2) (Alonix M310 available from Toagosei chemical Industry Co., Ltd.) was added 45 g of Microlith Yellow 4GA (tradename, available from Ciba-Geigy). The resulting mixture was stirred for 1 hour at 5,000 r.p.m. using Eiger Motor Mill (tradename of Eiger Engiierring) to obtain a pigment dispersion (GY-1).

Polymerizable compound (MN-2)

$$\begin{array}{l}CH_2O-C_3H_6-OCO-CH=CH_2\\ C_2H_5-C-O-C_3H_6-OCO-CH=CH_2\\ CH_2O-C_3H_6-OCO-CH=CH_2\end{array}$$

Preparation of Pigment Dispersion (GM-1)

To 255 g of the polymerizable compound (MN-2) was added 45 g of Microlith Red 3RA (tradename, available from Ciba-Geigy). The resulting mixture was stirred for 1 hour at 5,000 r.p.m. using Eiger motor mill (produced by Eiger Engineering Co., Ltd.) to obtain a pigment dispersion (GM-1).

Preparation of Pigment Dispersion (GC-1)

To 255 g of the polymerizable compound (MN-1) (Kayarad R604 available from Nippon Kayaku Co., Ltd.) were added 45 g of copper phthalocyanine (C.I.: Pigment 15), 1.13 g of Solsperse 5000 (tradename of ICI) and 3.37 g of Solsperse (tradename of ICI). The mixture was stirred for 1 hour at 5,000 r.p.m. using Eiger Motor Mill (tradename of Eiger Enginierring) to obtain a pigment dispersion (GC-1).

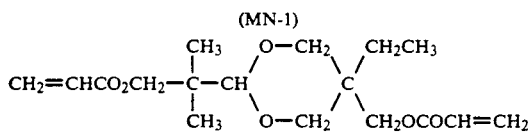

(MN-1)

Preparation of Light-sensitive Composition (PB-1)

To 45 g of the pigment dispersion (GY-1) were added 9 g of 20 weight % solution of the copolymer (1P-1) in the solvent (SV-1), 2.3 g of (RD-1), 6.2 g of (RD-3), 1 g of 0.5% solution of (FF-3) in (SV-1) and 5 g of (ST-1) to prepare an oily solution.

To the resulting solution were added 3.8 g of the silver halide emulsion (EG-1) and 24 g of the solid dispersion (KB-1), and the resulting mixture was stirred at 10,000 r.p.m. for 5 minutes at 60° C. using a dissolver of 40 φ to obtain a light-sensitive composition (PG-1) in the form of a W/O emulsion.

Preparation of Light-sensitive Composition (PG-1)

To 45 g of the pigment dispersion (GC-1) were added 9 g of 20 weight % solution of the copolymer (1P-1) in (SV-1), 2.3 g of (RD-1), 3.1 g of (RD-2), 1 g of 0.5% solution of (FF-3) in (SV-1) and 5 g of (ST-1) to prepare an oily solution.

To the resulting solution were added 3.8 g of the silver halide emulsion (EG-1) and 24 g of the solid dispersion (KB-1), and the resulting mixture was stirred at 10,000 r.p.m. for 5 minutes at 60° C. using a dissolver of 40 φ to obtain a light-sensitive composition (PG-1) in the form of a W/O emulsion.

Preparation of Light-sensitive Composition (PR-1)

To 45 g of the pigment dispersion (GC-1) were added 9 g of 20 weight % solution of the copolymer (1P-1) in (SV-1), 2.3 g of (RD-1), 6.2 g of (RD-2), 1 g of 0.5% solution of (FF-3) in (SV-1) and 5 g of (ST-1) to prepare an oily solution.

To the resulting solution were added 3.8 g of the silver halide emulsion (EG-1) and 24 g of the solid dispersion (KB-1), and the resulting mixture was stirred at 10,000 r.p.m. for 5 minutes at 60° C. using a dissolver of 40 φ to obtain a light-sensitive composition (PG-1) in the form of a W/O emulsion.

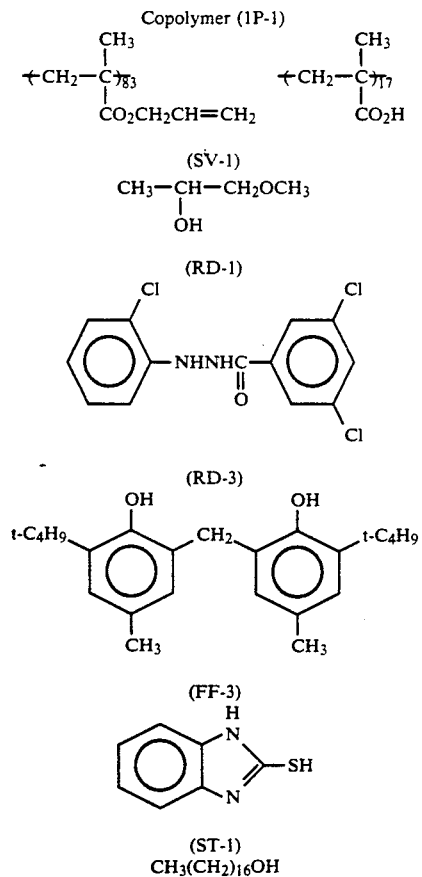

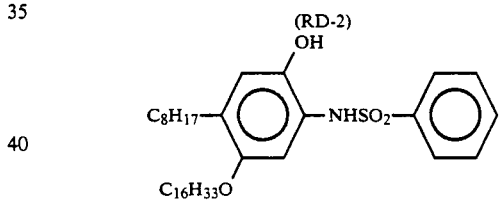

Preparation of Microcapsules Dispersion (CB-1)

To 4 g of 15% aqueous solution of the polymer (2P-1) was added 36 g of water. The mixture was adjusted to pH 5.0 using sulfuric acid. To the mixture was further added 60 g of 10% aqueous solution of the polymer (2P-2). The resulting mixture was stirred at 60° C. for 30 minutes. The mixture was added to the light-sensitive composition (PB-1), and the resulting mixture was stirred at 7,000 r.p.m. for 20 minutes at 50° C. using a dissolver of 40 φ to obtain a WOW emulsion.

To 250 g of the emulsion was added 2,250 g of distilled water, and the mixture was stirred for 15 minutes using a stirrer. The mixture was left for 1 hour to precipitate the emulsion. Then, 2,400 g of the supernatant was removed. To the residue was added 50 g of 6% aqueous solution of the polymer (2P-2). The mixture was stirred again to obtain a W/O/W emulsion.

Independently, to 31.5 g of melamine were added 52.2 g of 37% aqueous solution of formaldehyde and 170.3 g of water, and the resulting mixture was stirred at 60° C. for 30 minutes to obtain a transparent melamine-formaldehyde precondensate. To the above-prepared WOW emulsion at 40° C. was added 25 g of the precondensate. The mixture was stirred at 1,200 r.p.m. using a propeller wing, and was adjusted to pH 5.0 using 2N sulfuric acid. The mixture was then heated to 70° C. for 30 minutes, and stirred for 30 minutes. Further, to the mixture was added 10.3 g of 40% aqueous solution of urea, and the mixture was adjusted to pH 3.5 using 2N sulfuric acid, and then stirred at 70° C. for 40 minutes.

The mixture was cooled to 40° C. To the mixture was added 7.5 g of 2.5% aqueous solution of K-carrageenan. The resulting mixture was stirred for 10 minutes, and adjusted to pH 6.5 using 2N aqueous solution of sodium hydroxide to prepare a light-sensitive microcapsule dispersion (CB-1). The dispersion was immediately placed and stored at 8° C. in a refrigerator.

Polymer (2P-1)
Potassium polyvinylbenzenesulfinate
Polymer (2P-2)
Polyvinyl pyrrolidone (K-90 available from GAF)

Preparation of Microcapsule Dispersion (CG-1)

To 4 g of 15% aqueous solution of the polymer (2P-1) was added 26 g of water. The mixture was adjusted to pH 5.0 using sulfuric acid. To the mixture was further added 70 g of 10% aqueous solution of the polymer (2P-2). The resulting mixture was stirred at 60° C. for 30 minutes. The mixture was added to the light-sensitive composition (PG-1), and the resulting mixture was stirred at 5,000 r.p.m. for 20 minutes at 60° C. using a dissolver of 40 φ to obtain a W/O/W emulsion.

To 250 g of the emulsion was added 1,250 g of distilled water, and the mixture was stirred for 15 minutes using a stirrer. The mixture was left for 1 hour to precipitate the emulsion. Then, 1,400 g of the supernatant was removed. To the residue was added 50 g of 5% aqueous solution of the polymer (2P-2). The mixture was stirred again to obtain a W/O/W emulsion.

Then, a light-sensitive microcapsule dispersion (CG-1) was prepared in the same manner as in the preparation of the dispersion (CB-1). The dispersion was immediately placed and stored at 8° C. in a refrigerator Preparation of Microcapsule Dispersion (CR-1)

To 4 g of 15% aqueous solution of the polymer (2P-1) was added 36 g of water. The mixture was adjusted to pH 5.0 using sulfuric acid. To the mixture was further added 60 g of 10% aqueous solution of the polymer (2P-2). The resulting mixture was stirred at 60° C. for 30 minutes. The mixture was added to the light-sensitive composition (PR-1), and the resulting mixture was stirred at 5,000 r.p.m. for 20 minutes at 50° C. using a dissolver of 40 φ to obtain a W/O/W emulsion.

To 250 g of the emulsion was added 750 g of distilled water, and the mixture was stirred for 15 minutes using a stirrer. The mixture was left for 1 hour to precipitate the emulsion. Then, 900 g of the supernatant was removed. To the residue was added 50 g of 6% aqueous solution of the polymer (2P-2). The mixture was stirred again to obtain a W/O/W emulsion.

Then, a light-sensitive microcapsule dispersion (CG-1) was prepared in the same manner as in the preparation of the dispersion (CB-1). The dispersion was immediately placed and stored at 8° C. in a refrigerator.

Preparation of Light-sensitive Material (101)

The light-sensitive microcapsule dispersions (CB-1), (CG-1) and (CR-1) were stored for 2 days at 8° C. in a refrigerator. Then, 24 g of (CB-1), 36 g of (CG-1) and 57.6 g of (CR-1) were heated to 40° C. without stirring to obtain a mixture. To the mixture were added 0.5 g of the surface active agent (WW-1), 1.3 g of 10% aqueous solution of the surface active agent (WW-2) and 25 g of 10% aqueous solution of carboxylated polyvinyl alcohol (tradename: PVA KL318, available from Kuraray Co., Ltd.). The resulting mixture was stirred at 40° C. for 10 minutes, and filtered through a cloth of 44 μm mesh to prepare a coating solution.

Surface active agent (WW-1)

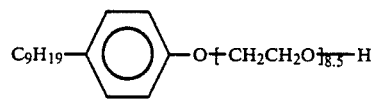

Surface active agent (WW-2)

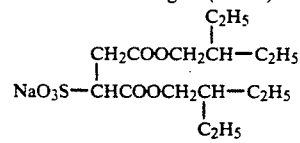

An aluminum film is evaporated onto a polyethylene terephthalate film (thickness: 25 μm) to prepare a support. The coating solution was coated over the aluminium film of the support in an amount of 131 ml/m² according to an extrusion method, and the coated layer of the solution was dried at 60° C. to prepare a light-sensitive material (101). The material was rolled up (inside: coated layer) at 25° C. and at 55% relative humidity. The rolled material was preserved in a moistureproofing bag laminated with aluminum at 25° C. and at 55% relative humidity.

Preparation of Image-receiving Material (RS-1)

A mixture of 240 g of calcium carbonate (tradename: PC700, available from Shiraishi Industrial Co., Ltd.), 5.6 g of a surface active agent (poize 520, available from Kao Co., Ltd.) and 354.4 ml of water was mixed and stirred at 8,000 r.p.m. for 3 minutes using a dispersing device (tradename: Ultradisperser LK-41, available from Yamato Science Co., Ltd.). To 52 g of the resulting dispersion was added 34.5 g of 10% aqueous solution of polyvinyl alcohol (tradename: PVA-17, available from Kuraray Co., Ltd.). To the mixture were further added 4 ml of 1% aqueous solution of the surface active agent (WW-3) and 22 ml of water to prepare a coating solution for an image-receiving layer.

Surface active agent (WW-3)

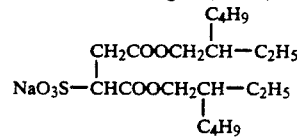

The coating solution was uniformly coated over a paper having a basis weight of 80 g/m² (i.e., a paper having a fiber length distribution [defined by JIS-P-8207] in which the sum of weight percent of 24 mesh residue and 42 mesh residue is within a range of 30-60%, as described in Japanese Patent Provisional Publication No. 63(1988)-86239) in an amount of 65 ml/m², and the coated layer of the solution was dried at 60° C. to prepare an image-receiving material (RS-1).

Image Formation and Evaluation Thereof

An image was formed on the image-receiving material (RS-1) using the light-sensitive material (101) according to the following manner at 25° C. and at 50% relative humidity.

The light-sensitive material was taken out of the moistureproofing bag, and was exposed to light at 20,000 lux and color temperature of 3100° K. for 1 second using a halogen lamp through a wedge in which the transmission density is continuously changed from 0 to 4.0, an ND filter having density of 1.0 and CC filters of yellow and magenta (produced by Fuji Photo Film Co., Ltd.) for adjusting a gray balance. After 10 seconds, the light sensitive material was heated on a hot plate from the side of the support for 1.5 second at 150° C. using a heat development apparatus exhausting a hot air.

The light-sensitive material was superposed on the image-receiving material (RS-1) in such a manner that the light-sensitive layer faced the image-receiving layer, and they were passed through a pressure roller (diameter: 3 cm) having a pressure of 1,200 kg/cm$^2$ at speed of 2 cm/second.

The image-receiving material was immediately removed from the light-sensitive material. A clear positive image was formed on the image-receiving material. The maximum and minimum densities of the image were measured using R-Rite 310. The maximum density was 1.22, and the minimum density was 0.09.

COMPARISON EXAMPLE 1

Preparation of Microcapsule Dispersion (CB-2)

A light-sensitive microcapsule dispersion (CB-2) was prepared in the same manner as in preparation of the dispersion (CB-1) in Example 1 except that 7.5 g of distilled water was used in place of 7.5 g of 2.5% aqueous solution of K-carrageenan. The dispersion was immediately placed and stored at 8° C. in a refrigerator.

Preparation of Microcapsule Dispersion (CG-2)

A light-sensitive microcapsule dispersion (CG-2) was prepared in the same manner as in preparation of the dispersion (CG-1) in Example 1 except that 7.5 g of distilled water was used in place of 7.5 g of 2.5% aqueous solution of K-carrageenan. The dispersion was immediately placed and stored at 8° C. in a refrigerator.

Preparation of Microcapsule Dispersion (CR-2)

A light-sensitive microcapsule dispersion (CR-2) was prepared in the same manner as in preparation of the dispersion (CR-1) in Example 1 except that 7.5 g of distilled water was used in place of 7.5 g of 2.5% aqueous solution of K-carrageenan. The dispersion was immediately placed and stored at 8° C. in a refrigerator.

Preparation of light-sensitive material (102)

The light-sensitive microcapsule dispersions (CB-2), (CG-2) and (CR-2) were stored for 2 days at 8° C. in a refrigerator. The microcapsules were deposited on the bottom of the vessels containing the dispersions. Therefore, the dispersions were heated to room temperature and stirred using a plastic bar. Then, 24 g of (CB-1), 36 g of (CG-1) and 57.6 g of (CR-1) were mixed to obtain a mixture. To the mixture were added 0.5 g of the surface active agent (WW-1), 1.3 g of 10% aqueous solution of the surface active agent (WW-2) and 25 g of 10% aqueous solution of carboxylated polyvinyl alcohol (tradename: PVA KL318, available from Kuraray Co., Ltd.). The resulting mixture was stirred at 40° C. for 10 minutes, and filtered through a cloth of 44 μm mesh to prepare a coating solution. The filtration required a long time, and a precipitation (aggregation of the microcapsules) remained on the cloth.

A light-sensitive material (102) was prepared in the same manner as in preparation of the material (101) in Example 1 using the above-prepared coating solution. The material was rolled up (inside: coated layer) at 25° C. and at 55% relative humidity. The rolled material was preserved in a moistureproofing bag laminated with aluminum at 25° C. and at 55% relative humidity.

Image Formation and Evaluation Thereof

An image was formed and evaluated in the same manner as in Example 1. As the results, the maximum density was 1.03, and the minimum density was 0.16.

The maximum density is low compared with the result of Example 1, since some of the microcapsule were precipitated (while the microcapsule dispersion was stored) and removed by the filtration.

The minimum density is high compared with the result of Example 1, since some of the microcapsule were destroyed when the microcapsule dispersion was stirred to disperse the precipitated microcapsules again.

It is apparent from the results of Example 1 and Comparison Example 1 that the light-sensitive material prepared according to the present invention forms a clear image having a high maximum density and a low minimum density, though the material is prepared by using a stored microcapsule dispersion.

EXAMPLE 2

Preparation of Microcapsule Dispersion (CB-3)

A light-sensitive microcapsule dispersion (CB-3) was prepared in the same manner as in preparation of the dispersion (CB-1) in Example 1 except that 150 g of the W/O/W emulsion was used without addition of water, precipitation of the emulsion and removal of the supernatant.

Preparation of Microcapsule dispersion (CG-3)

A light-sensitive microcapsule dispersion (CG-3) was prepared in the same manner as in preparation of the dispersion (CG-1) in Example 1 except that 150 g of the W/O/W emulsion was used without addition of water, precipitation of the emulsion and removal of the supernatant.

Preparation of Microcapsule Dispersion (CR-3)

A light-sensitive microcapsule dispersion (CR-3) was prepared in the same manner as in preparation of the dispersion (CR-1) in Example 1 except that 150 g of the W/O/W emulsion was used without addition of water, precipitation of the emulsion and removal of the supernatant.

Preparation of Light-sensitive Material (103)

A light-sensitive material (102) was prepared in the same manner as in preparation of the material (101) in Example 1 using the above-prepared microcapsule dispersions (CB-3), (CG-3) and (CR-3). The material was rolled up (inside: coated layer) at 25° C. and at 55% relative humidity. The rolled material was preserved in a moistureproofing bag laminated with aluminum at 25° C. and at 55% relative humidity.

Image Formation and Evaluation Thereof

An image was formed and evaluated in the same manner as in Example 1. As the results, the maximum density was 1.25, and the minimum density was 0.12. A linear stain was observed within the minimum density area. The stain was caused by the destroyed microcapsules.

Evaluation of the Shell of the Microcapsules

The light-sensitive materials (101) and (103) were cut into a piece of 2.6 cm × 10 cm. The pieces were placed in 10 ml of toluene for 10 minutes. The toluene was filtered, and examined by a liquid chromatography. As the results, a very small amount of the polymerizable compound (less than 5% of the coated amount) was detected in the piece of the material (101). On the other hand, 20% of the polymerizable compound was detected in the piece of the material (102). It is apparent from these results that the shell of the microcapsule of the material (101) was tightly formed around the core (containing the polymerizable compound) compared with the material (103).

We claim:

1. A process for preparation of a light-sensitive material comprising a support and a light-sensitive layer which contains silver halide, a reducing agent and an ethylenically unsaturated polymerizable compound, said silver halide, said reducing agent and said polymerizable compound being contained in microcapsules which are dispersed in the light sensitive layer, wherein the process comprises the steps of:
   (1) mixing a silver halide emulsion and the reducing agent with the polymerizable compound to prepare a light-sensitive composition;
   (2) emulsifying the composition in an aqueous medium to prepare an aqueous emulsion containing droplets of the composition in the aqueous medium;
   (3) forming a shell around the droplets of the composition contained in the aqueous emulsion to prepare a microcapsule dispersion wherein microcapsules are dispersed in the aqueous medium;
   (4) coagulating the aqueous medium, to set the microcapsule dispersion;
   (5) storing the set microcapsule dispersion;
   (6) melting the stored set microcapsule dispersion to prepare a coating solution of the light-sensitive layer; and
   (7) coating the solution on the support 2. The process as claimed in claim 1, wherein the specific gravity of the light-sensitive composition is more than 1.

3. The process as claimed in claim 1, wherein the aqueous medium is coagulated by adding an aqueous polymer as a gelation agent to the microcapsule dispersion and cooling the dispersion at the step (4), and the aqueous medium is melted by heating the dispersion at the step (6).

4. The process as claimed in claim 3, wherein the the gelation agent is a polysaccharide.

5. The process as claimed in claim 3, wherein the the gelation agent is used in the microcapsule dispersion in an amount of 0.01 to 10 weight %.

6. The process as claimed in claim 3, wherein the aqueous medium has a gel point at a temperature in the range of 0° C. to 40° C.

7. The process as claimed in claim 1, wherein the shell of the microcapsules is made of an amino-aldehyde resin.

8. The process as claimed in claim 7, wherein between the step (2) and (3), the process further contains the steps of:
   (a) precipitating the droplets of the light-sensitive composition in the aqueous emulsion;
   (b) removing at least 50% of a supernatant medium from the droplets; and
   (c) emulsifying the droplets in an aqueous medium again.

9. The process as claimed in claim 1, wherein the light-sensitive composition further contains a color image forming substance.

10. The process as claimed in claim 1, wherein the light-sensitive composition further contains a base precursor.

* * * * *